(12) United States Patent  
Yatsuda et al.

(10) Patent No.: US 7,753,573 B2
(45) Date of Patent: *Jul. 13, 2010

(54) LIGHT SOURCE AND VEHICLE LAMP

(75) Inventors: Yasushi Yatsuda, Tokyo (JP); Mitsunori Harada, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 112 days.

This patent is subject to a terminal disclaimer.

(21) Appl. No.: 11/781,337

(22) Filed: Jul. 23, 2007

(65) Prior Publication Data

US 2007/0263403 A1 Nov. 15, 2007

(51) Int. Cl.
*B60Q 1/00* (2006.01)

(52) U.S. Cl. .................. 362/539; 362/84; 362/298; 362/299; 362/300; 362/459; 257/98

(58) Field of Classification Search .............. 362/84, 362/298–300, 459, 539, 545, 800; 257/98
See application file for complete search history.

(56) References Cited

U.S. PATENT DOCUMENTS

| 3,876,900 | A | 4/1975 | Amatsuka et al. |
|---|---|---|---|
| 6,038,387 | A | 3/2000 | Machida |
| 6,066,861 | A | 5/2000 | Hohn et al. |
| 6,245,259 | B1 | 6/2001 | Hohn et al. |
| 6,277,301 | B1 | 8/2001 | Hohn et al. |
| 6,441,943 | B1 | 8/2002 | Roberts et al. |
| 6,565,247 | B2 | 5/2003 | Thominet |
| 6,576,930 | B2 | 6/2003 | Reeh et al. |
| 6,592,780 | B2 | 7/2003 | Hohn et al. |
| 6,613,247 | B1 | 9/2003 | Hohn et al. |
| 6,639,360 | B2 | 10/2003 | Roberts et al. |
| 6,669,866 | B1 | 12/2003 | Kummer et al. |
| 6,774,401 | B2 | 8/2004 | Nakada et al. |
| 6,809,342 | B2 | 10/2004 | Harada |
| 6,812,500 | B2 | 11/2004 | Reeh et al. |
| 6,827,473 | B2 | 12/2004 | Kobayashi |
| 6,850,001 | B2 | 2/2005 | Takekuma |

(Continued)

FOREIGN PATENT DOCUMENTS

DE 20206833 U 7/2002

(Continued)

OTHER PUBLICATIONS

Search Report for EP App. No. 04008913 (Jan. 24, 2006).

(Continued)

*Primary Examiner*—Sandra L O'Shea
*Assistant Examiner*—Meghan K Dunwiddie
(74) *Attorney, Agent, or Firm*—Kenealy Vaidya LLP

(57) ABSTRACT

A light source for vehicles can include a base having a cavity formed on its upper surface, an LED chip mounted in the cavity of the base, a resin portion for sealing the LED chip in the cavity, an optical member disposed above the base and apart from the LED chip, a light shielding portion disposed on the inner surface of the optical member and which forms a cutoff suited for a light distribution pattern, and a fluorescent substance layer disposed at least in regions other than the light shielding portion on the inner surface of the optical member.

26 Claims, 31 Drawing Sheets

U.S. PATENT DOCUMENTS

| | | |
|---|---|---|
| 6,855,958 B2 | 2/2005 | Sato et al. |
| 6,882,110 B2 | 4/2005 | Ishida et al. |
| 6,891,333 B2 | 5/2005 | Tatsukawa et al. |
| 6,948,836 B2 | 9/2005 | Ishida et al. |
| 6,951,416 B2 | 10/2005 | Sazuka et al. |
| 6,997,587 B2 | 2/2006 | Albou |
| 7,246,930 B2 * | 7/2007 | Yatsuda et al. ............. 362/539 |
| 2001/0019486 A1 | 9/2001 | Thominet |
| 2002/0001198 A1 | 1/2002 | Eschler et al. |
| 2002/0185966 A1 | 12/2002 | Murano |
| 2002/0191395 A1 | 12/2002 | Fleury |
| 2003/0198060 A1 | 10/2003 | Ishida et al. |
| 2003/0230757 A1 | 12/2003 | Suehiro et al. |
| 2004/0008516 A1 | 1/2004 | Amano |
| 2004/0018446 A1 | 1/2004 | Aoki et al. |
| 2004/0090790 A1 | 5/2004 | Ishida et al. |
| 2004/0130907 A1 | 7/2004 | Albou |
| 2004/0136197 A1 | 7/2004 | Ishida |
| 2004/0136202 A1 | 7/2004 | Ishida et al. |
| 2004/0156209 A1 | 8/2004 | Ishida |
| 2004/0160772 A1 | 8/2004 | Tatsukawa et al. |
| 2004/0160783 A1 | 8/2004 | Tatsukawa et al. |
| 2004/0196663 A1 | 10/2004 | Ishida et al. |
| 2004/0208020 A1 | 10/2004 | Ishida |
| 2004/0223338 A1 | 11/2004 | Koike et al. |
| 2004/0251469 A1 | 12/2004 | Yatsuda et al. |
| 2004/0257827 A1 | 12/2004 | Ishida et al. |
| 2005/0018446 A1 | 1/2005 | Ishida |
| 2005/0041434 A1 | 2/2005 | Yatsuda et al. |
| 2005/0041436 A1 | 2/2005 | Ishida |
| 2005/0052878 A1 | 3/2005 | Yamada et al. |

FOREIGN PATENT DOCUMENTS

| | | |
|---|---|---|
| DE | 10205779 | 10/2003 |
| EP | 1081771 | 3/2001 |
| EP | 1447616 | 8/2004 |
| EP | 1447617 | 8/2004 |
| GB | 2400166 | 10/2004 |
| GB | 2402203 | 12/2004 |
| JP | 59124179 | 7/1984 |
| JP | 01120702 | 5/1989 |
| JP | 05226691 | 9/1993 |
| JP | 06202242 | 7/1994 |
| JP | 10190065 | 7/1998 |
| JP | 10256607 | 9/1998 |
| JP | 11087782 | 3/1999 |
| JP | 2000150968 | 5/2000 |
| JP | 2001127346 | 5/2001 |
| JP | 2001196639 | 7/2001 |
| JP | 2001210872 | 8/2001 |
| JP | 2001-266620 A | 9/2001 |
| JP | 2001345483 | 12/2001 |
| JP | 2002-008415 A | 1/2002 |
| JP | 2002094127 | 3/2002 |
| JP | 2002289926 | 10/2002 |
| JP | 2003031007 | 1/2003 |
| JP | 2003031011 | 1/2003 |
| JP | 2003123517 | 4/2003 |
| JP | 2003346518 | 12/2003 |
| JP | 2004-063499 A | 2/2004 |
| JP | 2004056075 | 2/2004 |
| JP | 2004063499 | 2/2004 |
| JP | 2004-158294 A | 6/2004 |
| JP | 2004-241349 A | 8/2004 |
| JP | 2004-247150 A | 9/2004 |
| WO | 03/071352 A1 | 8/2003 |
| WO | WO03071352 | 8/2003 |

OTHER PUBLICATIONS

Search Report for EP App. No. 04005014.8 (Oct. 6, 2006).

* cited by examiner

LIGHT SOURCE AND VEHICLE LAMP

This application and invention claims the benefit under 35 U.S.C. §119 of Japanese Patent Application No. 2003-323820, filed on Sep. 17, 2003, and the benefit under 35 U.S.C. §120 of U.S. patent application Ser. No. 10/808,551 filed on Mar. 25, 2004 now U.S. Pat. No. 7,246,930, which are both hereby incorporated in their entireties by reference.

FIELD

The presently disclosed subject matter relates to a light source and more particularly to a light source apparatus for vehicle lamps employing a plurality of LED elements and to a vehicle lamp such as a headlight and an auxiliary headlight using the light source apparatus.

DESCRIPTION OF THE RELATED ART

Conventional large-current type white LED light sources are configured, for example, as shown in FIG. 22. In FIG. 22, a white LED light source 1 includes an LED chip 3 mounted in a cavity 2a provided on the upper surface of a heat radiating core 2. A resin 4 containing fluorescent substance such as silicon or epoxy can be located on the heat radiating core 2 and include a lens 5 located above the resin 4. Drive current can be supplied to the LED chip 3 by wire-bonding the upper ends of lead terminals 6 and 7 with gold wires 6a and 7a, respectively, to electrode portions of the heat radiating core 2 and the LED chip 3. The lead terminals are arranged around the heat radiating core 2.

The LED chip 3 is, for example, a blue LED chip emitting blue light while the fluorescent substance in the resin 4 emits yellow light as a result of excitation by blue light. Light L1 emitted from the LED chip 3 strikes the fluorescent substance in the resin 4, exciting the fluorescent substance. As a result of color mixture between excitation light L2 and light L1 from the LED chip 3, white light is emitted from the LED light source 1.

Incidentally, in this type of white LED light source 1, nearly 90% of the supplied drive current is converted to heat at present, while only a small part of the drive current is converted to light. Internal quantum efficiency of the LED chip 3 declines when its temperature rises due to heat generation. In addition, excitation light conversion efficiency of the fluorescent substance in the resin 4 is even more affected by temperature rise than the LED chip 3.

For the white LED light source 1, therefore, measuring heat radiation may be important in certain circumstances because temperature rise leads to not only reduced emitted light flux but also chromaticity shift.

Consequently, the heat radiating core 2 is made of a highly thermally conductive material such as copper, with the LED chip 3 mounted on top of the heat radiating core 2, to increase the heat radiation efficiency of the LED chip 3. Additionally, the internal surface of the cavity 2a, formed on the upper surface of the heat radiating core 2, is employed as a reflection horn to improve extraction efficiency of light emitted from the LED chip 3. Such a configuration allows use of a large current such as 200 mA and above in the white LED light source 1. Higher brightness and larger light quantity for white LED light sources are on their way to becoming a reality as a result of higher efficiency LED chips and improved conversion efficiency of fluorescent substances.

The application of LED light sources in light sources for illumination and vehicle headlights is becoming practical, thanks also to advantages such as long life and low power consumption of LED chip.

However, use of a large-current type white LED light source as a light source for a vehicle headlight presents problems as described below, making it difficult to actually configure the LED light source as a vehicle headlight. Light distribution characteristics of a vehicle headlight, in particular low-beam light distribution characteristics, have been standardized as shown in FIG. 23, requiring a horizontal line that reduces glare on oncoming vehicles. The difference between light and dark in luminous intensity (hereinafter referred to as "cutoff line C1") is formed at a 15-degree elbow line and provides better recognition of pedestrians and traffic signs. Additionally, a minimum center luminous intensity of 8000 cd or more in the front view provides the driver's far distance visibility. It should be noted that center luminous intensities of 20000 cd or more for vehicle headlights using a conventional halogen light bulb, and 40000 cd or more for vehicle headlights using an HID (xenon discharge lamp) are common.

To achieve such a light distribution by using the white LED light source 1 as a light source, the vehicle headlight as shown in FIG. 24 or 25 has been hitherto conceived. In FIG. 24, a vehicle headlight 8 is comprised of a light shielding plate 8b that forms a low-beam light distribution pattern, that is, forms the above-mentioned cutoff near the focus F at the back of a convex lens 8a for collecting light. The white LED light source 1 is located immediately behind the light shielding plate 8b. Light emitted from the white LED light source 1 travels toward the focus F of the convex lens 8a and is collected by the convex lens 8a, with unnecessary or unwanted light blocked by the light shielding plate 8b which is provided near the focus F, thus causing the light to be irradiated forward in a light distribution pattern having a so-called low-beam cutoff as shown in FIG. 23.

In FIG. 25, a vehicle headlight 9 is comprised of a light shielding plate 9b that forms a low-beam light distribution pattern, that is, it forms the above-mentioned cutoff near the focus F at the back of convex lens 9a. A reflector 9c includes or consists of a rotary elliptic surface that has a focus located near the focus F of the convex lens 9a and has another focus located on the optical axis of the convex lens 9a. The white LED light source 1 can be located near the other focus of the reflector 9c and the shielding plate 9b can be arranged perpendicularly to the optical axis of the convex lens 9a, that is, in a horizontal orientation relative to the convex lens 9a. Light emitted from the white LED light source 1 is reflected by the reflector 9c, travels toward one of the focuses, e.g., the focus F of the convex lens 9a, and is collected by the convex lens 9a. Unnecessary or unwanted light can be partially or totally blocked by the light shielding plate 9b provided near the focus F, thus causing the light to be irradiated forward in a light distribution pattern having a so-called low-beam cutoff as shown in FIG. 23.

Incidentally, while a cutoff can be readily formed by projecting the shadow of the light shielding plate 8b or 9b with the convex lens 8a or 9a in the vehicle headlight 8 or 9, a secondary optical system's lens in addition to the lens of the white LED light source 1 (the primary optical system's lens) should be used. This results in approximately 30 to 40% of light from the white LED light source 1 being blocked by the light shielding plate 8b or 9b, thus considerably lowing light utilization efficiency.

However, the emission shape of the white LED light source 1 is rectangular or circular, making it difficult to form a clear cutoff without using the light shielding plate 8b or 9b.

Further, a luminous intensity value of a light-collecting optical system is, in general, roughly determined by light source brightness (brightness at the focus position of the secondary optical system's lens) and secondary optical system area. Therefore, it is difficult for LED light sources that are less bright than the existing halogen light bulbs or HIBs to achieve a peak luminous intensity value. Even assuming that increasing brightness will be available with LED light sources, it is unlikely that an LED light source will be as bright as an HID light source in the future. In the case of the vehicle headlight 9 shown in FIG. 25 in particular, therefore, a larger optical system area may be required to obtain a similar brightness as compared to the existing projector type light. Additionally, the LED light source becomes as deep in structural volume requirements as the existing projector type lamp due to difficulties involved in making use of surface emission (the advantage of the LED light source), thus making it difficult to achieve size and thickness reduction in the vehicle headlight.

As for the vehicle headlight 8 shown in FIG. 24, the luminous intensity value near the focus F declines sharply with increasing distance of the light shielding plate 8b from the emission portion of the LED light source 1. According to experiments carried out by the applicants, although the light shielding plate 8b can be located within 2 mm from the emission portion to obtain approximately 60% of luminous intensity as shown by the graph in FIG. 26, it is difficult and nearly impossible to arrange the light shielding plate 8b within 2 mm from the emission portion because the LED light source 1 is commonly covered with the resin-molded lens 5 for improved light extraction efficiency and protection of the LED chip 3, the resin 4 that includes a fluorescent substance, and the gold wires 6a and 7b.

In contrast, in the vehicle headlight 8, the emission shape of the emission portion of the LED light source 1 is projected forward by the convex lens 8a, thus reflecting the uneven color and the brightness distribution of the LED chip 3 as is in the light distribution characteristic. Since the white LED light source 1 is configured as described earlier with reference to FIG. 22, the emission portion is substantially the surface of the resin 4 that includes the fluorescent substance. Therefore, the color of light on the emission portion surface is determined by the ratio of transmitted light from the LED chip 3 and excitation light generated by the fluorescent substance. Since light transmitted from the LED chip 3 is in abundance directly above the LED chip 3, the light is bluish white in the case of a blue LED chip, with the light turning progressively yellow-tinted white with increasing distance from the chip, thus resulting in uneven color. This is true with the brightness distribution, affecting the light distribution characteristic due to forward irradiation of light that has uneven brightness.

Further, in the vehicle headlight 8, the emission shape of the white LED light source 1 or an image close thereto is projected forward by the convex lens 8a, thus causing, for example, a secondary cutoff line C2 to be formed as shown in FIG. 27. The secondary cutoff line C2, when irradiated onto the screen or road surface, leads to uneven light distribution. As a possible configuration for making such an uneven light distribution due to the secondary cutoff line less conspicuous, the focal distances of sets of vehicle headlights 8 can be made different from one another by providing a plurality of sets of vehicle headlights 8 (four sets in the illustration) as shown in FIG. 28. This configuration, however, fails to eliminate the secondary cutoff line C2, resulting in a plurality of secondary cutoff lines C2 appearing, and thereby making it difficult or impossible to generate a smooth gradation in the light distribution characteristic.

In contrast, other conceivable methods for forming the image of the white LED light source 1 near the focus F of the convex lens 8a are possible. For example, a second optical system's lens can be arranged to include a second convex lens 8d consisting of a single lens as shown in FIG. 30 and a second convex lens 8e consisting of two lenses as shown in FIG. 31. While allowing generation of a gradation in the light distribution characteristic by the use of a plurality of lenses (the convex lens 8a and the second convex lens 8d or 8e), these configurations lead to a complex optical system and more parts, resulting in higher parts and assembly costs and difficulties in optical axis alignment.

SUMMARY

In light of the foregoing and other reasons, the presently disclosed subject matter provides a light source apparatus, such as a vehicle lamp, headlight or auxiliary lamp or headlight, that is particularly suited for irradiating light forward by using a plurality of LED elements.

According to an aspect of the presently disclosed subject matter there is provided a light source that includes a base having a cavity formed on its upper surface; an LED chip mounted in the cavity of the base; a resin portion for sealing the LED chip in the cavity; an optical member disposed above the base and apart from the LED chip; a light shielding portion disposed on the inner surface of the optical member, for forming a cutoff suited for a light distribution pattern for vehicle headlight; and a fluorescent substance layer disposed at least in regions other than the light shielding portion on the inner surface of the optical member.

The base can be formed as a heat radiating core. The base can also be formed as a ceramic base. The optical member can be a lens. The optical member can also be a flat cover. The light shielding portion may be positioned within 2 mm, and possibly 1 mm from the LED chip. The light shielding portion can be comprised of a thin film formed on the inner surface of the optical member. The light shielding portion can be comprised of a member in plate form adhered to the inner surface of the optical member. The member in plate form can have a given thickness along the optical axis. The light source may further include a second light shielding portion disposed on the outer surface of the optical member. The inner surface of the light shielding portion can be formed as a reflection surface. The reflection surface can be disposed slanted so as to reflect light from the LED chip. The inner surface of the base cavity may include a second reflection surface confronting the reflection surface, for reflecting reflected light from the reflection surface toward the optical axis. The reflection surface can include a thin metal film formed on the surface of the light shielding portion. The reflection surface can include a surface of the light shielding portion made of, for example, a metallic material. The fluorescent substance layer can be formed in thin film form. The fluorescent substance layer can also be formed by impregnating silicon film with fluorescent substance. The optical member, the inner surface of the light shielding portion or the reflection surface, each of which is in contact with the fluorescent substance layer, can be coated with a $SiO_2$ layer. The fluorescent substance layer can be formed so as to become thinner with increasing distance from the optical axis. The outer surface of the flat cover can be provided with a microtexture structure at least in regions not corresponding to the light shielding portion. The microtexture structure can be formed on the flat cover surface. The microtexture structure can be formed in sheet form separate from the flat cover and adhered to the outer surface of the flat cover. The microtexture structure can also be formed on a surface not corresponding to the light shielding portion of the flat cover, and the second light shielding portion can be formed projecting along the optical axis on a surface corresponding to the light shielding portion of the flat cover.

According to another aspect of the disclosed subject matter there is provided a vehicle headlight comprising any one of the light sources configured for use with a vehicle headlight; and a projection lens disposed such that the focus on the light source side lies in the vicinity of the light shielding portion of the light source apparatus, wherein the projection lens irradiates forward the shape of an emission portion of the light source apparatus cut off by the light shielding portion.

Light emitted from the LED chip can be emitted from the resin portion directly or after reflection by the cavity internal surface and can fall on the fluorescent substance layer. Then, the fluorescent substance in the fluorescent substance layer is excited by light from the LED chip, producing mixed color light from the mixture of fluorescence by excitation and light from the LED chip. The mixed color light can form a cutoff by the light shielding portion and can be emitted along the optical axis. Therefore, the light can be irradiated in a given light distribution pattern for a vehicle headlight by projecting the light with the projection lens along the optical axis, for example, to the front of the automobile.

At this time, heat generated by the LED chip is prevented from transfer to the fluorescent substance layer by isolating the fluorescent substance layer from the LED chip, that is, providing a space between the fluorescent substance layer and the LED chip. This suppresses temperature rise in the fluorescent substance layer due to heat generation by the LED chip.

Consequently, a decline in excitation light conversion efficiency due to temperature rise in the fluorescent substance layer can be suppressed, suppressing in return a reduction in excitation light and thereby reducing a change in luminous intensity attributed to temperature rise, and enhancing luminous intensity of mixed color light (light resulting from mixture of fluorescence by excitation and light from the LED chip) and improving light extraction efficiency.

Isolation of the LED chip from the fluorescent substance layer allows uneven brightness of the LED chip's emission portion to fall on the fluorescent substance layer in a diffused manner, thus reducing uneven color and forming a gradation with a smooth brightness distribution.

Further, arrangement of the light shielding portion within the light source apparatus allows the LED chip and the light shielding portion to be brought closer to each other, making it possible to form a cutoff with the high-brightness portion near the emission portion and therefore achieving higher brightness and realizing a clear cutoff.

If the base is formed as a heat radiating core, heat generated due to driving of the LED chip can be radiated via the heat radiating core. The heat radiating core can be made, for example, of copper, thus suppressing temperature rise in the LED chip.

If the base is formed as a ceramic base, heat generated due to the driving of the LED chip is radiated via the ceramic base made, for example, of a ceramic material such as aluminum nitride or alumina, thus suppressing temperature rise in the LED chip. Additionally, forming the ceramic base as a laminated structure and providing wiring patterns inside the base eliminate the need for lead materials, etc., for driving the LED chip, reducing the parts count to nearly half and cutting down parts and assembly costs.

If the optical member is a lens, mixed color light from mixture of fluorescence by excitation and light from the LED chip is converged by the optical member, thus causing the light to be irradiated along the optical axis.

If the optical member is a flat cover, mixed color light from mixture of fluorescence by excitation and light from the LED chip transmits through the flat cover, thus causing the light to be irradiated as is along the optical axis.

If the light shielding portion is located within 2 mm, and possibly within 1 mm, from the LED chip, high luminous intensity can be obtained at the light shielding portion. For example, approximately 60% of the LED chip luminous intensity can be obtained when within 2 mm and approximately 90% of the LED chip luminous intensity can be obtained when within 1 mm.

If the light shielding portion is comprised of a thin film formed on the inner surface of the optical member, the light shielding portion can be readily constituted, for example, by forming the thin film on the inner surface of the optical member by sputtering, etc., and the configuration of the light source apparatus can be simplified because there is no need to provide members for supporting the light shielding portion.

If the light shielding portion is comprised of a member in plate form adhered to the inner surface of the optical member, the light shielding portion can be readily constituted, for example, by adhering the light shielding portion in plate form to the inner surface of the optical member. The configuration of the light source apparatus can be simplified because there is no need to provide members for supporting the light shielding portion.

If the light shielding portion in plate form has a given thickness taken along the optical axis, when light emitted from the light source apparatus along the optical axis is irradiated by the projection lens, color separation can be partly or totally eliminated by shielding light. For example, the thickness of the light shielding portion in plate form can be defined by edge portions respectively located near the focus positions of red light and blue light attributed to chromatic aberration of the projection lens.

It should be noted that the given thickness of the light shielding portion in plate form can correspond to the difference in focal distance between red light and blue light and is approximately 2% of the focal distance of the projection lens.

Further, if a second light shielding portion is provided on the outer surface of the optical member, when light emitted from the light source apparatus along the optical axis is irradiated by the projection lens, color separation can be partly or totally eliminated by shielding light. For example, one of the edges of the light shielding portion and the second light shielding portion can be located, respectively, near the focus positions of red light and blue light attributed to aberration of the projection lens.

It should be noted that the distance between the light shielding portion and the second light shielding portion along the optical axis can correspond to the difference in focal distance between red light and blue light and is approximately 2% of the focal distance of the projection lens. The distance can be adjusted by selecting the thickness of the optical member as appropriate.

If the inner surface of the light shielding portion is formed as a reflection surface, light emitted from the LED chip and falling on the light shielding portion is reflected by the reflection surface and returned to the LED chip side. Then, the light is reflected again by the cavity inner surface, and part of the light passes through the optical member and is emitted externally, thus improving light extraction efficiency.

If the reflection surface is arranged in a slanted configuration so as to reflect light from the LED chip, light reflected by the reflection surface travels toward a position displaced from the LED chip, and the light reflected again by the cavity inner surface is guided to regions other than the light shielding portion and is emitted externally, further improving light extraction efficiency.

If a second reflection surface for reflecting reflected light from the reflection surface toward the optical axis is provided opposite the reflection surface and on the inner surface of the base cavity, light reflected by the reflection surfaced travels toward the cavity inner surface and is reflected by the second reflection surface and emitted externally, further improving light extraction efficiency.

If the reflection surface is comprised of a thin metal film formed on the surface of the light shielding portion, the reflection surface can be readily constituted, for example, by forming the thin metal film on the light shielding portion surface by sputtering. The thin metal film can be formed from aluminum, nickel or other similar material.

If the reflection surface is comprised of a member in plate form and is provided on the surface of the light shielding portion, the reflection surface can be readily constituted, for example, by affixing a metal plate such as stainless steel or aluminum to the surface of the light shielding portion by adhesion or other method.

The fluorescent substance layer can be maintained roughly at a constant thickness as a whole by forming the layer as a thin film. Therefore, the optical path length is the same for light incident on the fluorescent substance layer at the same incidence angle, thus suppressing uneven color.

If the fluorescent substance layer is formed as a flat convex lens such that the fluorescent substance layer becomes thinner from the inner surface of the optical member to the inside or outside as the distance from the optical axis increases, the optical path length is not substantially extended in the surrounding regions that are distant from the optical axis, despite an increase in incidence angle from the LED chip to the fluorescent substance layer. Thus, it is possible to reduce chromaticity deviation, e.g., reduce the possibility of mixed color light from becoming tinged with yellow light.

If the fluorescent substance layer is comprised of a silicon film impregnated with fluorescent substance, the fluorescent substance layer can be readily formed by impregnating a silicon material with fluorescent substance and forming the fluorescent substance layer on a glass plate, for example, with a spin coater or by molding.

If one of the optical member, the inner surface of the light shielding portion, or the reflection surface, (each of which can be in contact with the fluorescent substance layer), is coated with a $SiO_2$ layer, the coating of the surface with the $SiO_2$ layer readily brings the fluorescent substance layer into intimate contact with the optical member, regardless of the materials of which the optical member and the light shielding portion are made, thus preventing the fluorescent substance layer from falling off.

If the fluorescent substance layer is formed so as to become thinner with increasing distance from the optical axis, the luminous intensity of light from the LED chip declines with increasing distance from the optical axis. By adjusting the amount of fluorescent substance in the fluorescent substance layer through adjustment of the thickness in accordance with the decline in luminous intensity, it is possible to maintain the chromaticity of mixed color light substantially constant, thus suppressing occurrence of uneven color.

If the outer surface of the flat cover is provided with a microtexture structure at least in regions not corresponding to the light shielding portion, mixed color light incident on the flat cover inner surface at a relatively large incidence angle can be prevented from becoming attenuated as a result of repeated reflection inside the flat cover. The mixed color light can be emitted externally based on the complex surface shape of the microtexture structure, thus improving light extraction efficiency and enhancing brightness on the optical axis through directivity adjustment of light emitted externally by the optical action of the microtexture structure. This allows more light flux to be incident within the acceptance angle of the vehicle headlight's projection lens, providing improved light utilization efficiency and higher luminous intensity to the vehicle headlight.

If the microtexture structure is formed on the flat cover surface, the microtexture structure can be readily provided by providing a shape corresponding to the microtexture in molds during molding of the flat cover.

If the microtexture structure is formed in sheet form separately from the flat cover and adhered to the outer surface of the flat cover, the microtexture structure can be readily provided by adhering the microtexture structure in sheet form to the outer surface of a conventional flat cover.

If the microtexture structure is formed on a surface not corresponding to the light shielding portion of the flat cover and if the second light shielding portion is formed projecting along the optical axis on the surface corresponding to the light shielding portion of the flat cover, effects of chromatic aberration due to the blue light wavelength component can be partially or entirely eliminated by arranging the second light shielding portion (the portion for limiting the blue light wavelength component of light passing through the light shielding portion) outwardly of the microtexture structure.

Light from the LED chip of the light source apparatus can excite the fluorescent substance in the fluorescent substance layer and then change into mixed color light from mixture with excitation light, which is then emitted via the light shielding portion. Then, light falls on the incidence surface of the projection lens and is converged by the projection lens, thus causing the light to be irradiated forward. At this time, a given light distribution characteristic is formed by the light shielding portion, providing a so-called low-beam light distribution characteristic that partially or entirely eliminates glaring or dazzling light from being projected onto oncoming vehicles.

At this time, heat generated by the LED chip can be partially or entirely prevented from being transferred to the fluorescent substance layer by isolating the fluorescent substance layer from the LED chip. This suppresses temperature rise in the fluorescent substance layer due to heat generation by the LED chip.

Consequently, a decline in excitation light conversion efficiency due to temperature rise in the fluorescent substance layer is suppressed, suppressing in return a reduction in excitation light and thereby reducing luminous intensity change attributed to temperature rise, enhancing luminous intensity of mixed color light and improving light extraction efficiency.

Isolation of the LED chip from the fluorescent substance layer allows uneven brightness of the LED chip's emission portion to fall on the fluorescent substance layer in a diffused manner, thus reducing uneven color and forming a gradation with smooth brightness distribution.

Further, arrangement of the light shielding portion within the light source apparatus allows the LED chip and the light shielding portion to be brought closer to each other, making it possible to form a cutoff with the high-brightness portion near the emission portion and therefore achieving higher brightness and realizing a clear cutoff.

Thus, by allowing light from the LED chip to fall on the fluorescent substance layer that is isolated from the LED chip, exciting the fluorescent substance in the fluorescent substance layer, emitting mixed color light outside the light source apparatus via the light shielding portion and projecting the light forward with the projection lens, it is possible to suppress temperature rise in the fluorescent substance layer for improved utilization efficiency of light emitted from the LED chip and partially or totally eliminate chromaticity deviation due to temperature rise for providing a light distribution pattern and brightness distribution appropriate for a light source and in particular for a vehicle headlight. Consequently, it is possible to provide a light source apparatus for a vehicle lamp and a vehicle lamp suited for use as a headlight or auxiliary headlight and which uses an LED chip as its light source.

BRIEF DESCRIPTION OF THE DRAWINGS

The above and other aspects, features and advantages of the presently disclosed subject matter will become more apparent from the following detailed description when taken in conjunction with the accompanying drawings, in which.

DESCRIPTION OF EXEMPLARY EMBODIMENTS

Exemplary embodiments of the presently disclosed subject matter will now be described in detail with reference to FIGS. 1 to 21.

It should be noted that while the embodiments described below are subject to and include various technical features, the scope of the presently disclosed subject matter should not be limited thereby.

Figure 1:
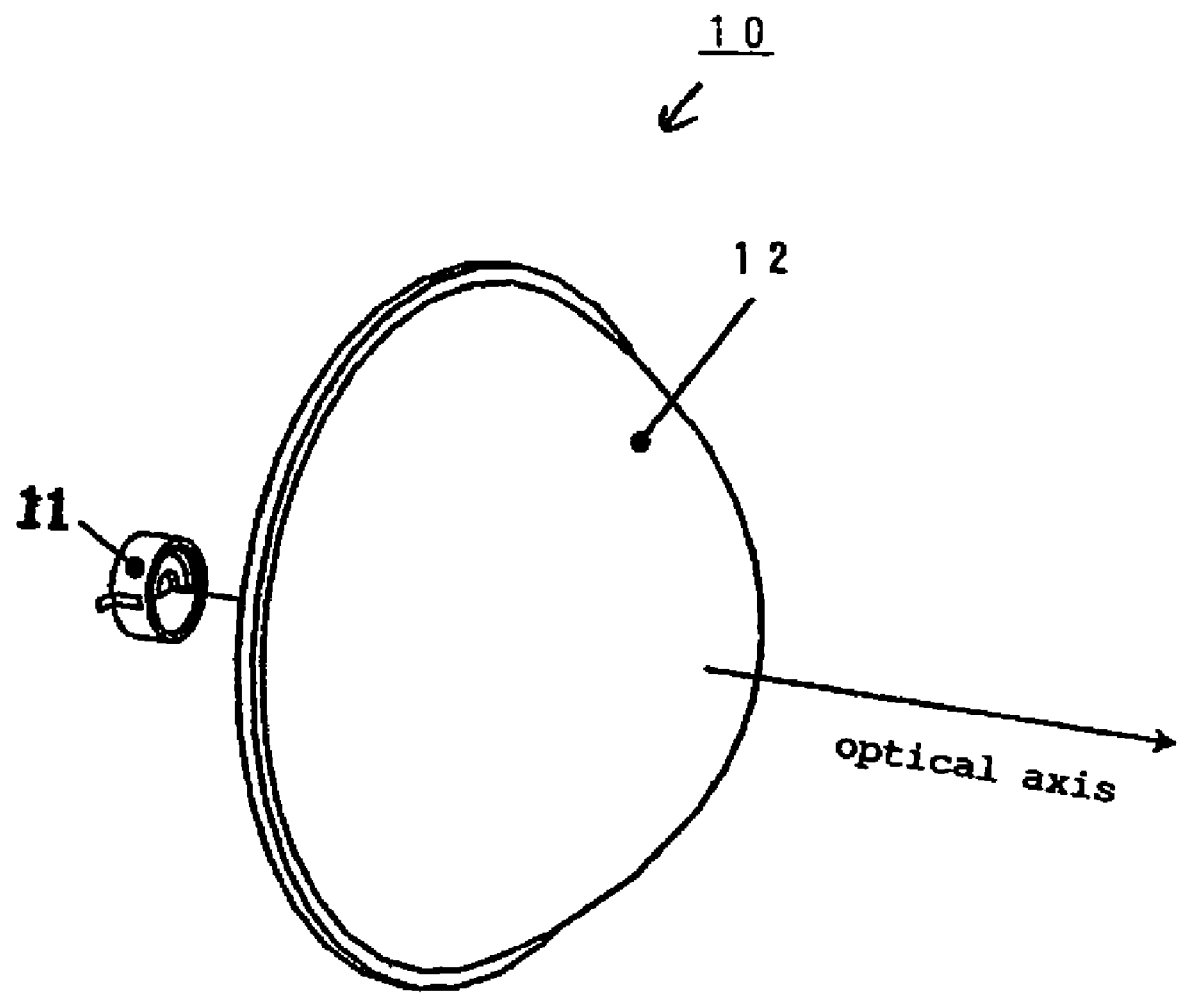
FIG. 1 is a schematic perspective view showing an embodiment of a vehicle headlight made in accordance with the principles of the presently disclosed subject matter.
Figure 2:
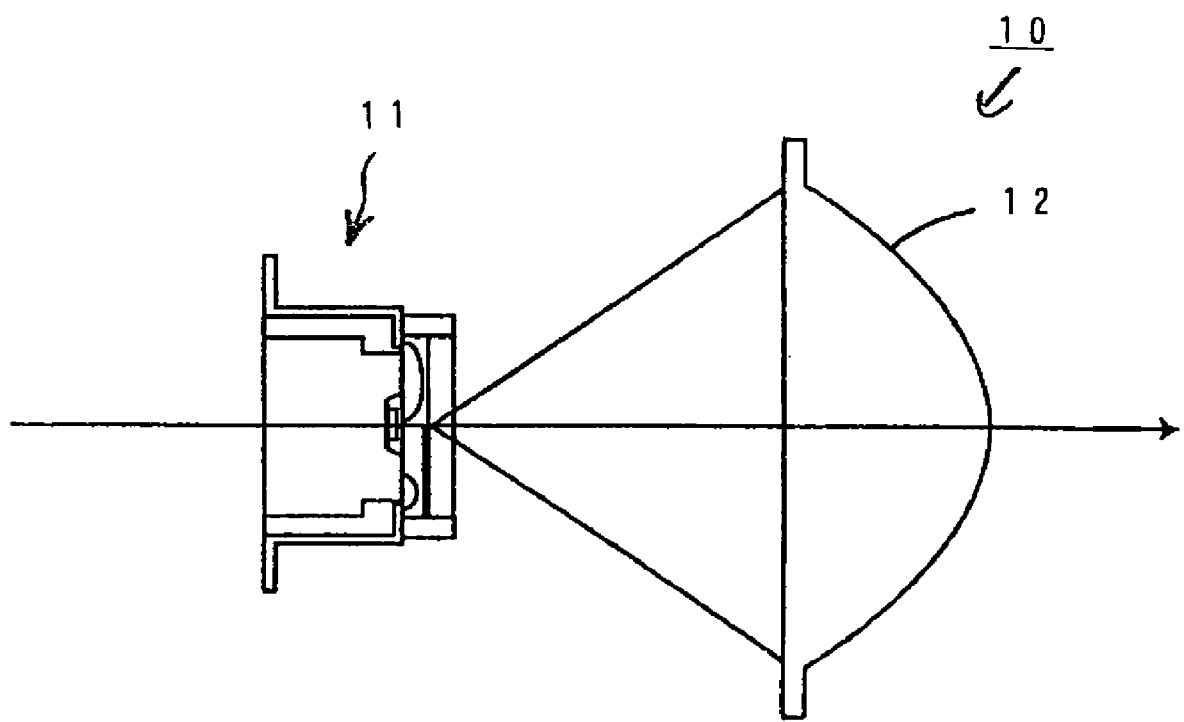
FIG. 2 is a schematic sectional view showing a configuration of the embodiment of the vehicle headlight shown in FIG. 1.
Figure 3:
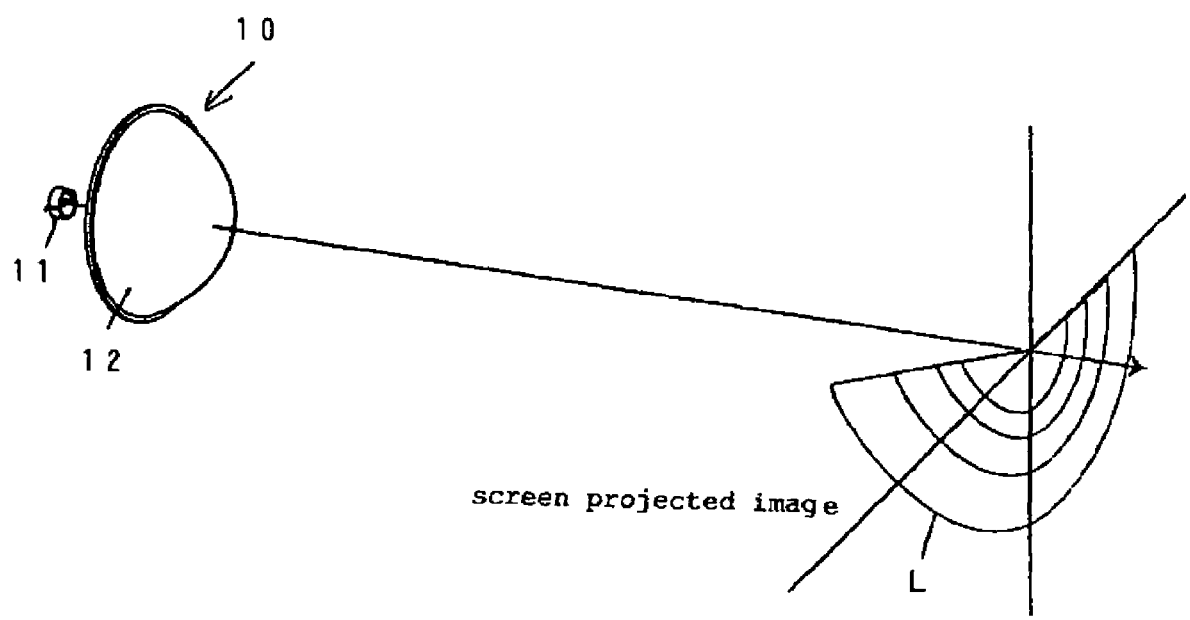
FIG. 3 is a schematic perspective view of the vehicle headlight shown in FIG. 1 showing a light distribution pattern.

FIGS. 1 to 3 illustrate a configuration of an embodiment of a light source made in accordance with principles of the presently disclosed subject matter.

Figure 4:
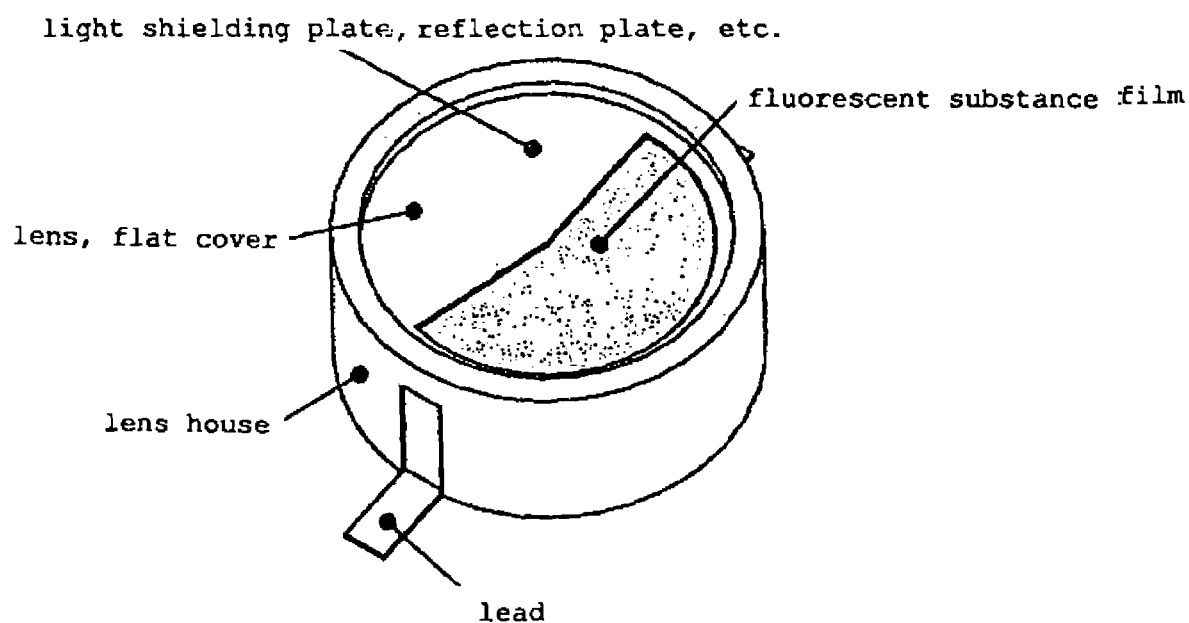
FIG. 4 is a schematic perspective view showing a configuration of the light source apparatus as shown in FIG. 1.
Figure 5:
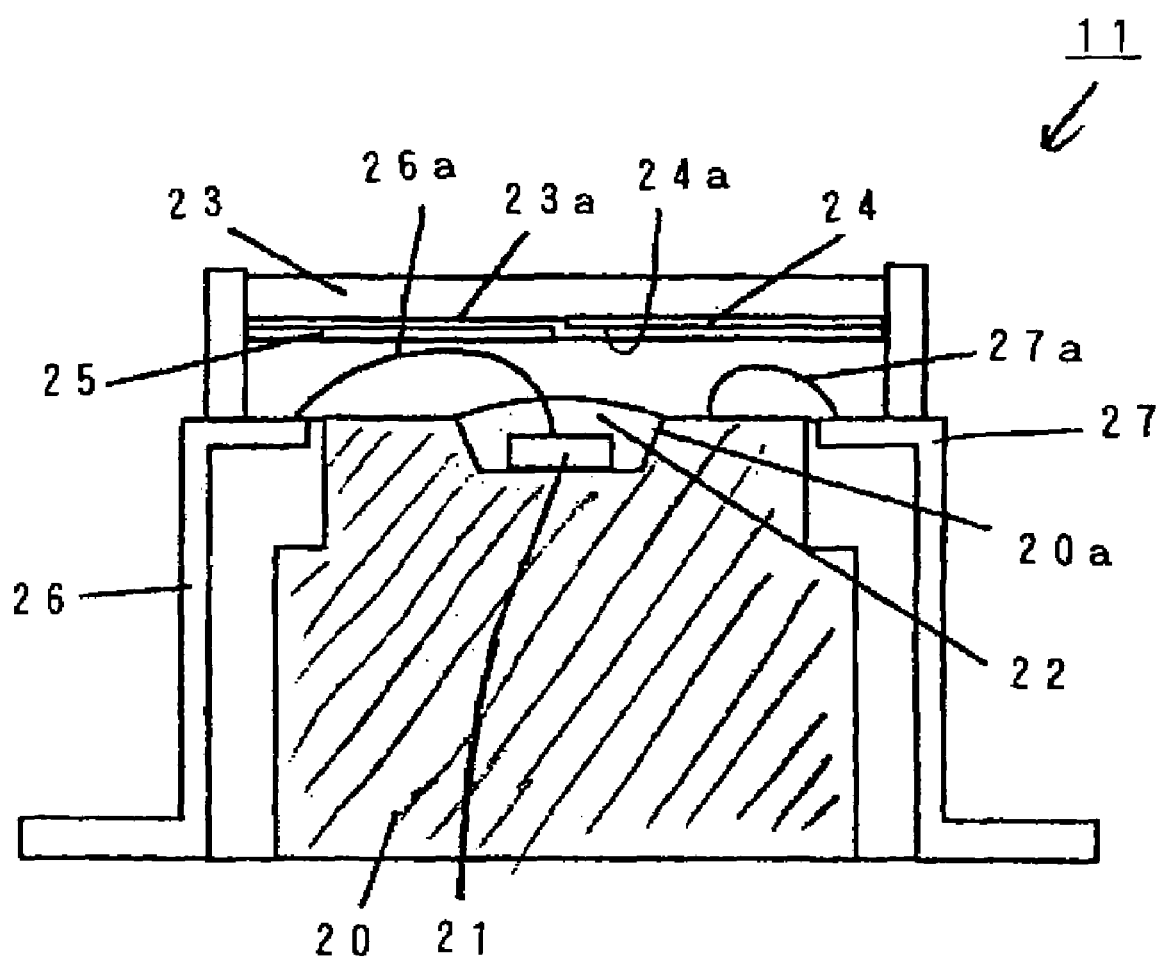
FIG. 5 is a schematic sectional view showing a configuration of the light source apparatus shown in FIG. 4.

In FIGS. 1 and 2, the light source is configured as a vehicle headlight 10 that can include a light source apparatus 11 and a projection lens 12 for converging light from the light source apparatus 11. The light source apparatus 11 can include a base 20, an LED chip 21, a resin portion 22, an optical member 23, a light shielding portion 24, a fluorescent substance layer 25 and a pair of lead terminals 26 and 27, as shown in FIGS. 4 and 5.

The base 20 can be constituted of a highly thermally conductive heat radiating core such as copper and can be provided with a concave cavity 20a formed on the upper surface so as to expand upward.

The LED chip 21 is, for example, a blue LED chip attached to the bottom surface of the cavity 20a of the base 20 by die bonding, etc., with the electrode portion on the upper surface of the LED chip wire-bonded to the upper end of the lead terminal 26 by a gold wire 26a. On the other hand, the upper surface of the base 20 can be similarly wire-bonded to the upper end of the other lead terminal 27 by a gold wire 27a.

Figure 23:
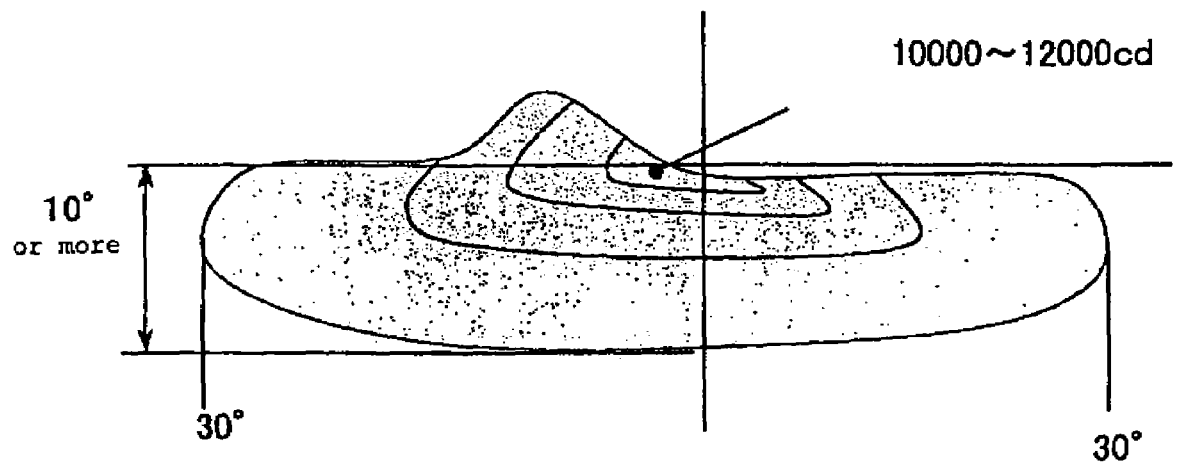
FIG. 23 is a graph showing a standard low-beam light distribution characteristic for a vehicle headlight.
Figure 24:
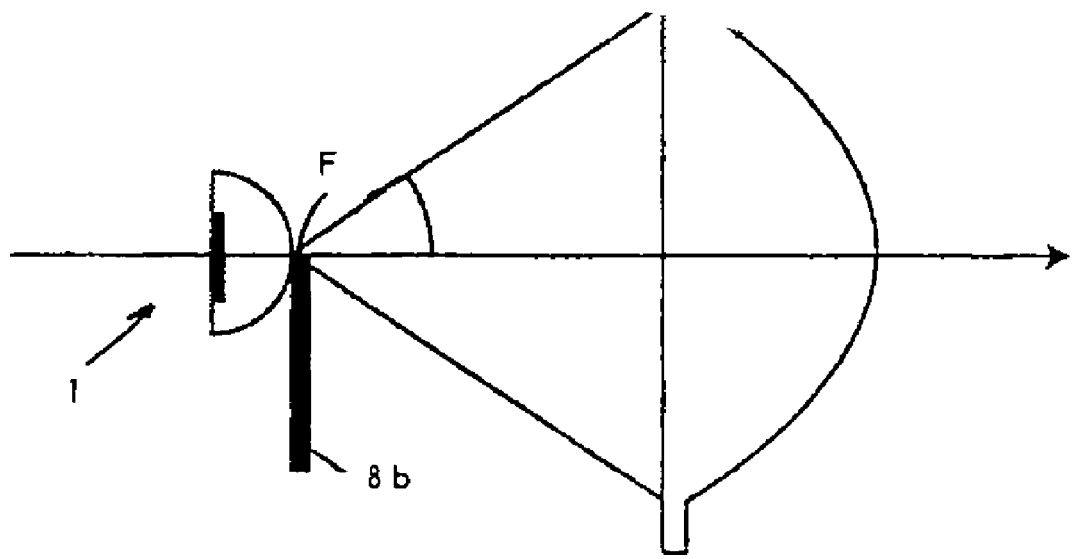
FIG. 24 is a schematic sectional view showing an example configuration of a vehicle headlight using the light source apparatus shown in FIG. 22.
Figure 25:
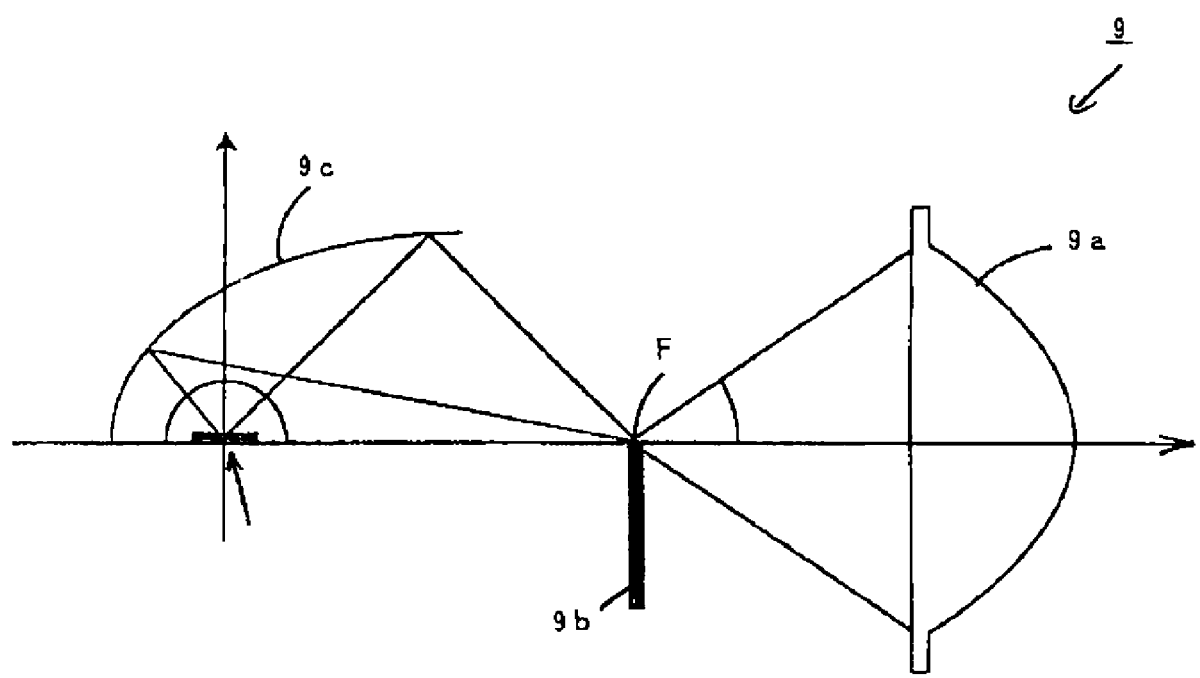
FIG. 25 is a schematic sectional view showing another example configuration of a vehicle headlight using the light source apparatus shown in FIG. 22.
Figure 26:
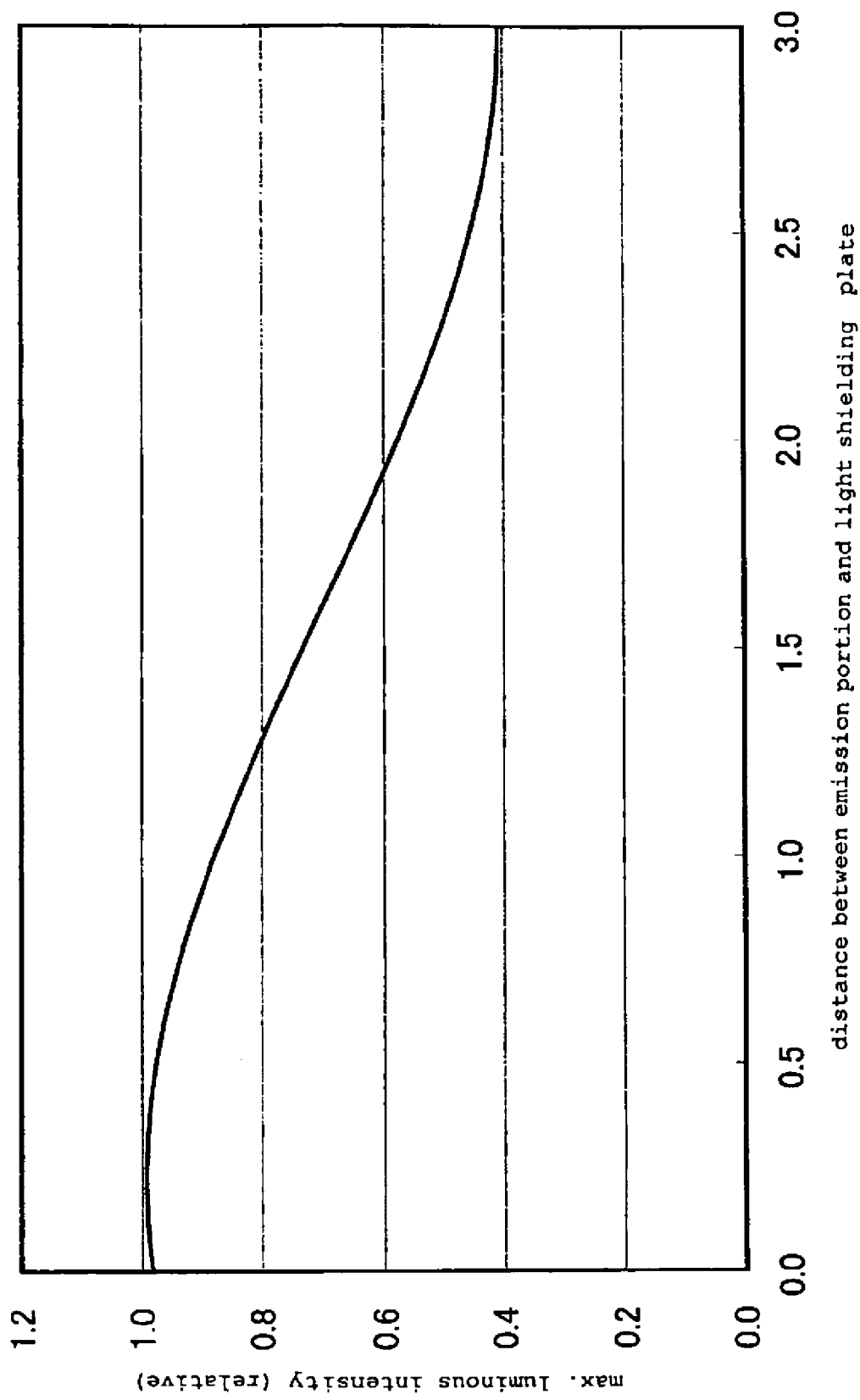
FIG. 26 is a graph showing luminous intensity change with distance from an LED chip.
Figure 27:
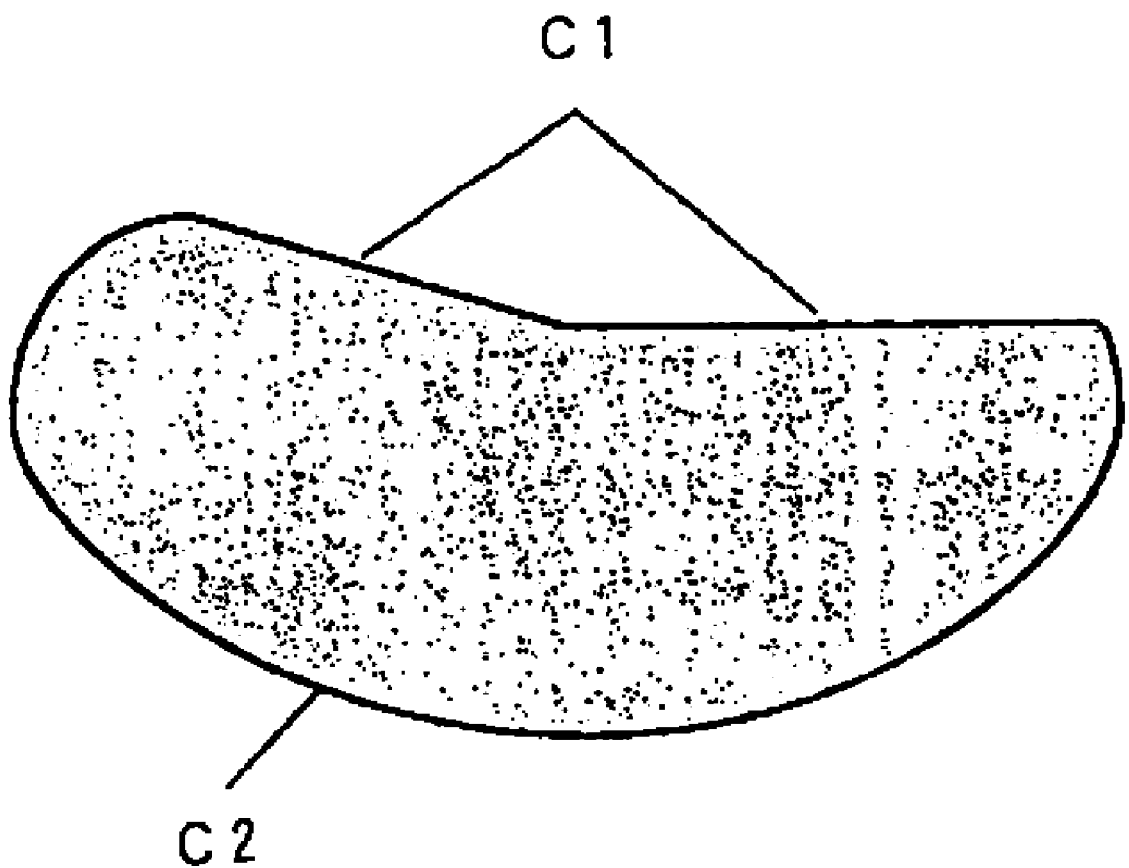
FIG. 27 is a graph showing a light distribution pattern for the vehicle headlight shown in FIG. 24.
Figure 28:
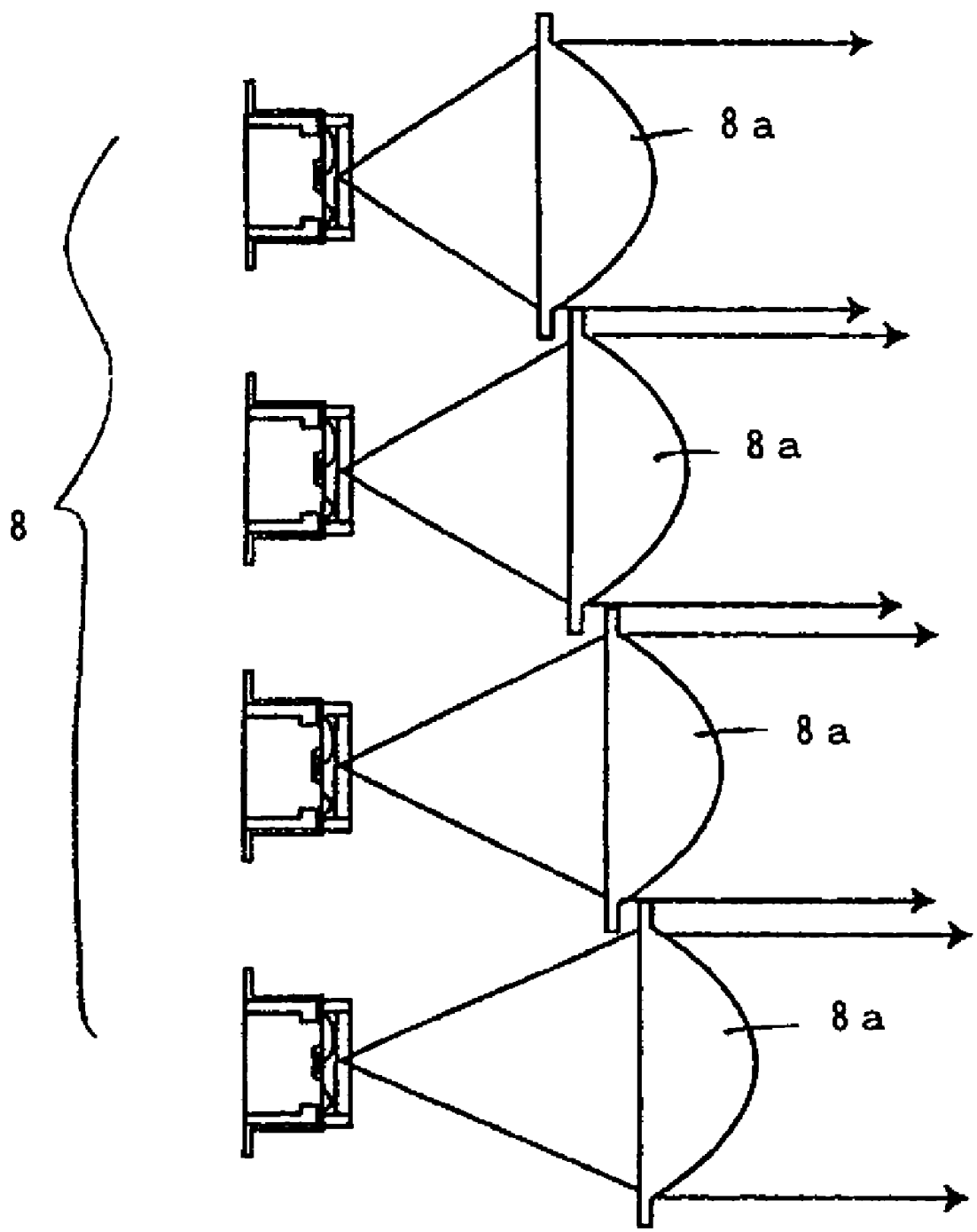
FIG. 28 is a schematic sectional view showing still another example configuration for a vehicle headlight using the light source apparatus shown in FIG. 22.
Figure 29:
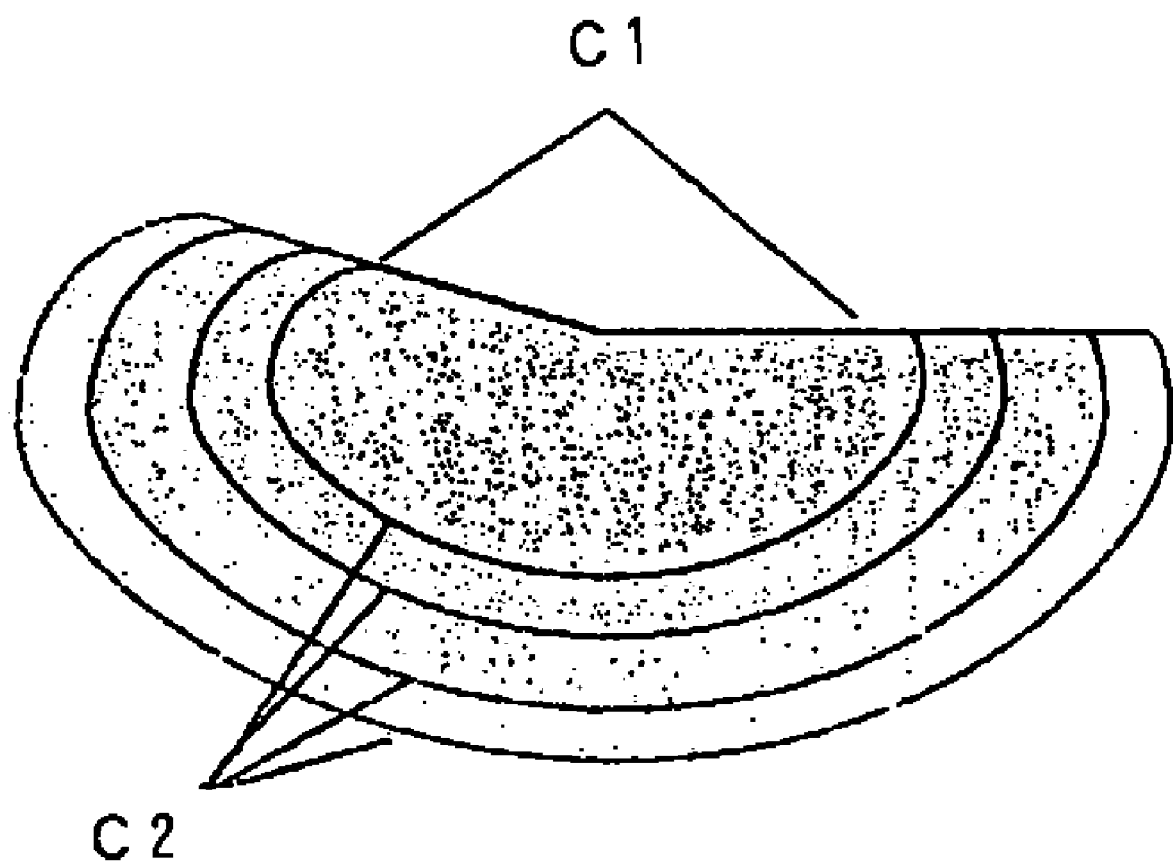
FIG. 29 is a graph showing a light distribution pattern for the vehicle headlight shown in FIG. 28.
Figure 30:
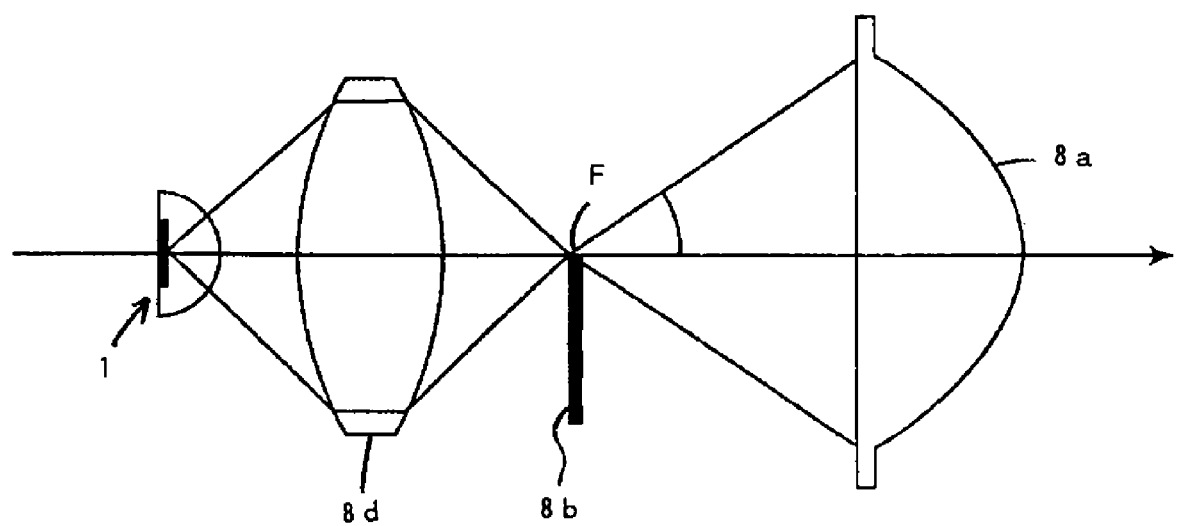
FIG. 30 is a schematic sectional view showing another example configuration of a vehicle headlight using the light source apparatus shown in FIG. 22.
Figure 31:
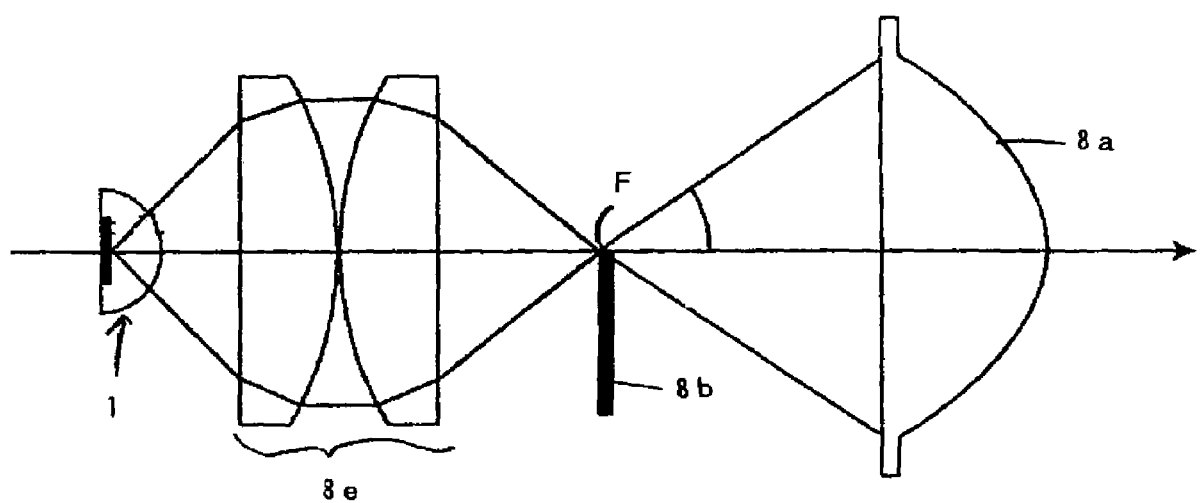
FIG. 31 is a schematic sectional view showing another example configuration of a vehicle headlight using the light source apparatus shown in FIG. 22.

The resin portion 22 can be made of a translucent resin such as silicon, that is charged into the cavity 20a of the base 20 and hardened. The optical member 23 can be a flat cover (or lens) made of glass, resin or other translucent material and arranged above the LED chip 21 and roughly perpendicularly to the optical axis. The light shielding portion 24 can be arranged on part of the region of the inner surface of the optical member 23 (lower surface in FIG. 5), forming a so-called cutoff by blocking part of light emitted from the LED chip 21 and adjusting the light distribution pattern projected by the projection lens 12 into a low-beam light distribution pattern for a vehicle headlight, for example, as shown in FIG. 23.

The light shielding portion 24 can also be arranged on the optical axis of the LED chip 21 within 2 mm, and possibly 1 mm, from the upper surface of the LED chip 21, i.e., the emission surface. Further, the light shielding portion 24 may be provided with a reflection surface 24a on its lower surface and on the side of the LED chip 21. The light shielding portion 24 can be made of a metal plate such as stainless steel or aluminum, and the light shielding portion 24 and reflection surface 24a may be adhered or otherwise attached to the inner surface of the optical member 23.

Alternatively, the reflection surface 24a may be formed as a thin metal film on the surface of the light shielding portion 24, for example, by sputtering. Aluminum can be used, for example, for use as a thin metal film, and can achieve reflectance on the order of 90%. The thin metal film may have a two-layer structure of nickel and aluminum. In this case, it is possible to form the flatter reflection surface 24a by arranging nickel on the inside and thereby smoothing the surface of the optical member 23 or the light shielding portion 24. Further, if the light shielding portion 24 and the reflection surface 24a are formed as an integral thin film, a thickness of 100 nm or more can be used to prevent transmission of light.

Figure 6:
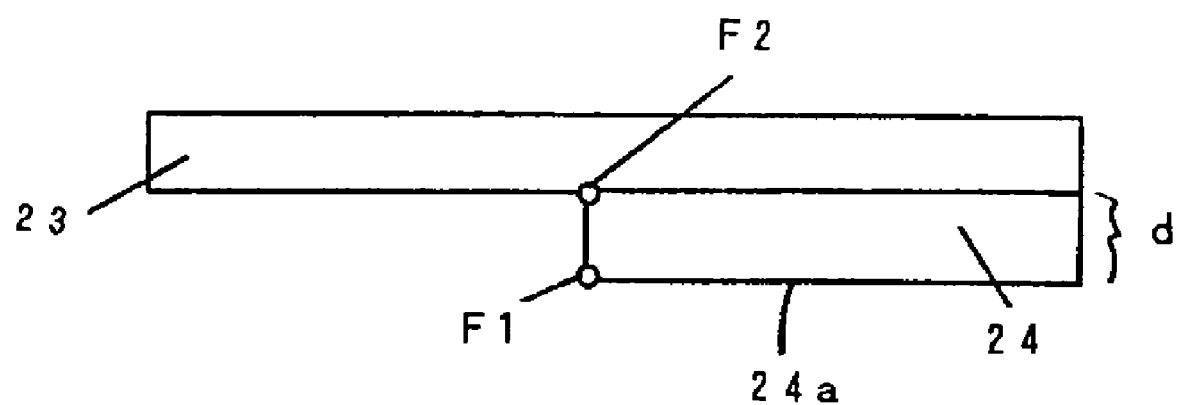
FIG. 6 is a partially enlarged sectional view showing a configuration of the light shielding portion for the light source apparatus shown in FIG. 4.
Figure 7:
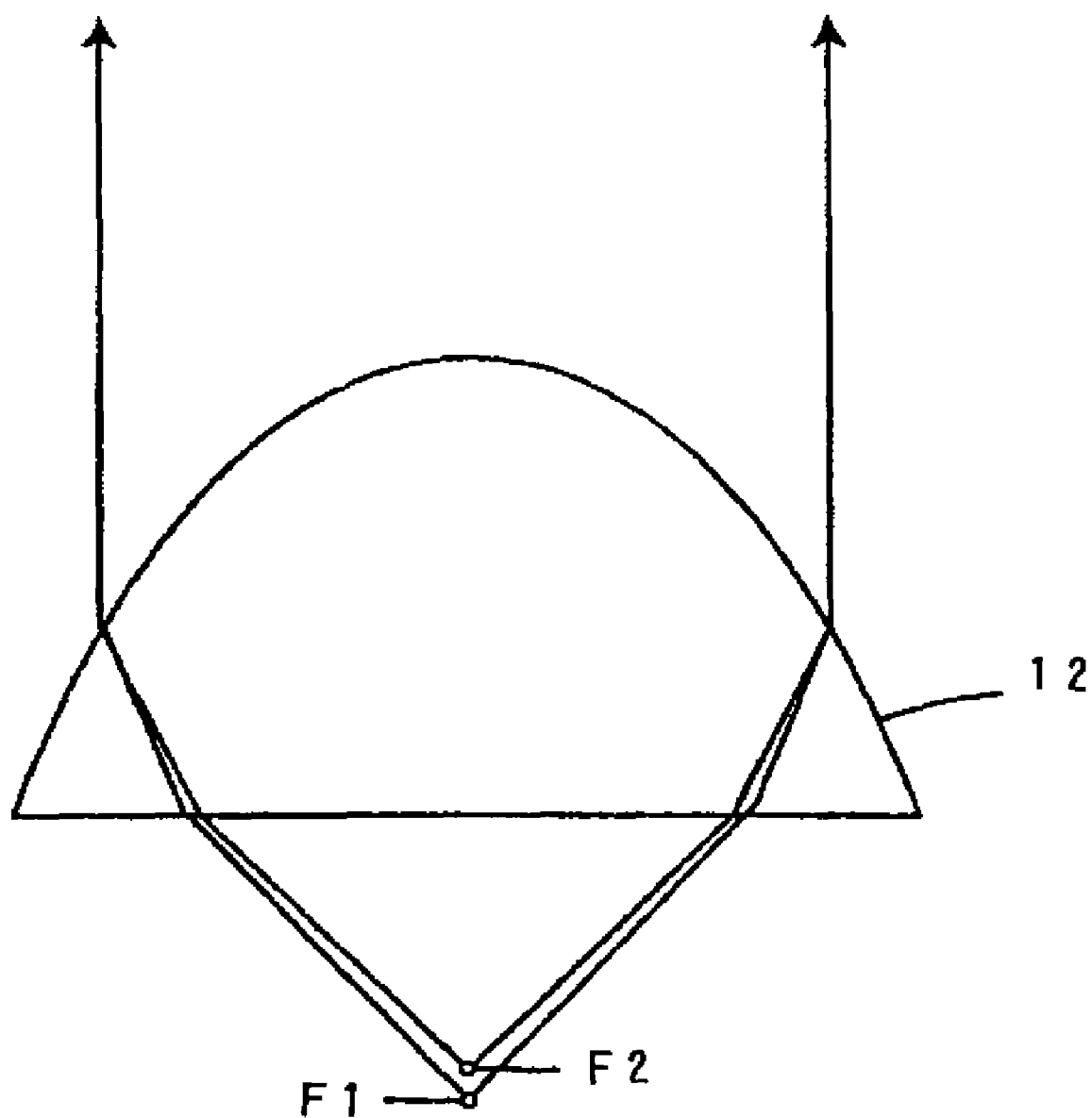
FIG. 7 is a schematic view showing chromatic aberration of the projection lens of the vehicle headlight shown in FIG. 1.

The light shielding portion 24 can have a given thickness "d" along the optical axis, as shown in FIG. 6. The thickness can be the difference between a focus position F1 according to red wavelength light (the longer wavelength side) and a focus position F2 according to blue wavelength light (the shorter wavelength side) of the projection lens 12 (refer to FIG. 7), that is, generally approximately 2% of the focal distance of the projection lens 12 if the projection lens 12 is made of an ordinary material. This configuration helps to eliminate chromatic aberration caused by a difference in refraction index of the material of the projection lens 12 for red wavelength light and blue wavelength light, and reliably blocks, using the light shielding portion 24, red wavelength light and blue wavelength light separated due to chromatic aberration of the projection lens, thus reducing or eliminating color separation in light that is irradiated in a forward direction.

Figure 8:
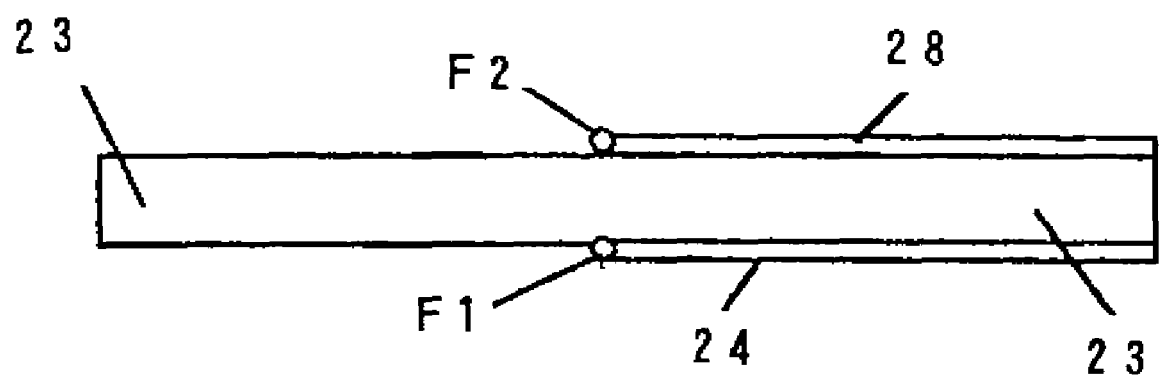
FIG. 8 is a partially enlarged sectional view showing an exemplary configuration of a modification of the light shielding portion for the light source apparatus shown in FIG. 4.

It should be noted that, instead of associating the thickness d of the light shielding portion 24 with the difference in focal distance according to red wavelength light (longer wavelength side) and blue wavelength light (shorter wavelength side) of the projection lens 12, the thickness of the optical member 23 may be associated with the difference in focal distance by providing a second light shielding portion 28 on the outer surface of the optical member 23 and corresponding with the light shielding portion 24 that is positioned on the inner surface of the optical member 23, as shown in FIG. 8.

The fluorescent substance layer 25 can be formed in thin film form, for example, by impregnating a silicon material with fluorescent substance (not shown) and affixing it to the inner surface of the optical member 23, for example, by adhesion. The fluorescent substance is excited by blue light from the LED chip 21 and emits yellow light—excitation light. The yellow light is mixed with blue light from the LED chip 21 to change into white light that will be emitted externally.

The surfaces of the optical member 23 and the light shielding portion 24 can be coated with a $SiO_2$ film 23a, thus enhancing adhesion of the fluorescent substance layer 25 to the optical member 23 and the light shielding portion 24 and preventing the fluorescent substance layer 25 from falling off. The $SiO_2$ film 23a can be formed by a thin film coating method such as sputtering and may be formed concurrently with the reflection surface 24a if the reflection surface 24a consists of a thin film. If the optical member 23 is made of glass, the $SiO_2$ film 23a may be omitted.

Further, the fluorescent substance layer 25 can be arranged at a given distance from the upper surface of the LED chip 21. This reduces thermal conduction from the LED chip 21 to the fluorescent substance layer 25, thus suppressing temperature rise in the fluorescent substance layer 25.

The conversion efficiency of the fluorescent substance layer 25 generally declines, at 100° C., to approximately 70% of its level at room temperature and to about 50% or less at 150° C. In contrast, the LED chip 21 drops in output to 90% at 100° C. and 70% at 150° C.

Consequently, chromaticity deviation in mixed color light can be reduced by maintaining the temperature of the fluorescent substance layer 25 low as compared with that of the LED chip 21, for example, at 70% or so of that of the LED chip 21. This can be accomplished through adjustment of thermal resistance between the LED chip 21 and the fluorescent substance layer 25 and by adjusting the distance therebetween and the medium provided therebetween, and thereby reducing the difference in efficiency reduction as a result of temperature rise in the LED chip 21 and the fluorescent substance layer 25.

In the light source apparatus 11 shown in FIG. 2, for example, it is possible to reduce the temperature of the fluorescent substance layer 25 to 70° C. or so when the temperature of the LED chip 21 is 100° C. by spacing the LED chip 21 and the fluorescent substance layer 25 1.2 mm apart, thus suppressing the decline in conversion efficiency of the fluorescent substance layer 25 due to temperature rise and reducing chromaticity deviation.

Figure 9:
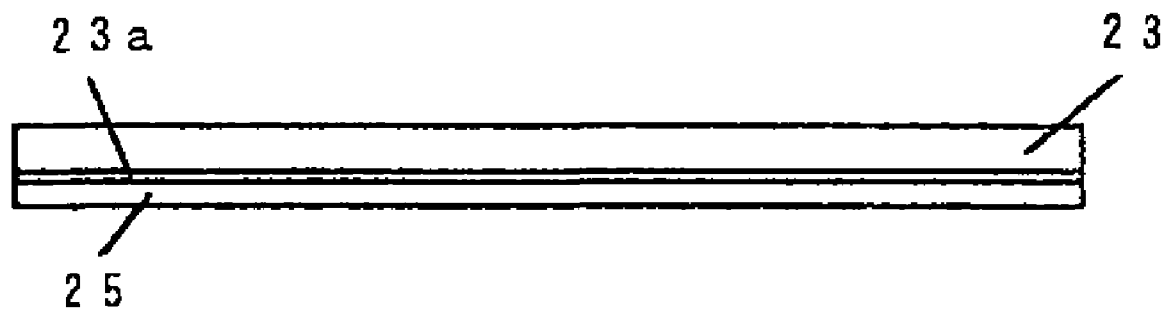
FIG. 9 is a partially enlarged sectional view showing a configuration of the fluorescent substance layer for the light source apparatus shown in FIG. 4.

The fluorescent substance layer 25 can be maintained at a roughly constant thickness as shown in FIG. 9 by forming the fluorescent substance layer 25 as a thin film. Therefore, the optical path length in the fluorescent substance layer 25 is the same for light incident on the fluorescent substance layer 25 at the same incidence angle, thus suppressing uneven color.

Figure 10:
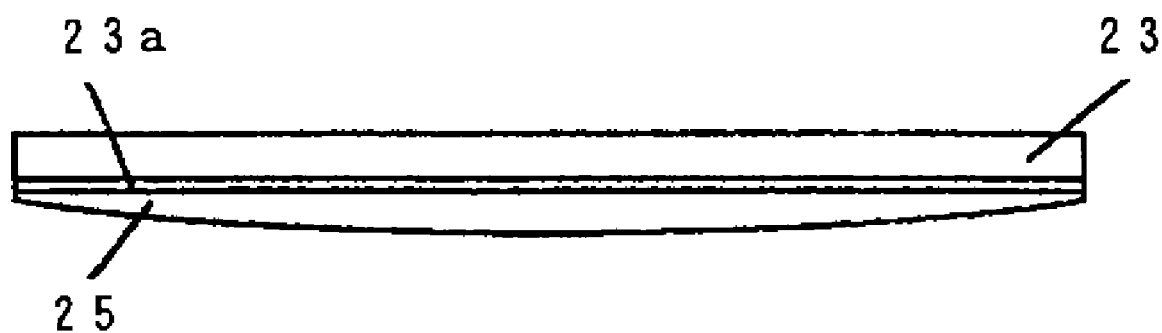
FIG. 10 is a partially enlarged sectional view showing an example modification of the fluorescent substance layer shown in FIG. 9.
Figure 11:
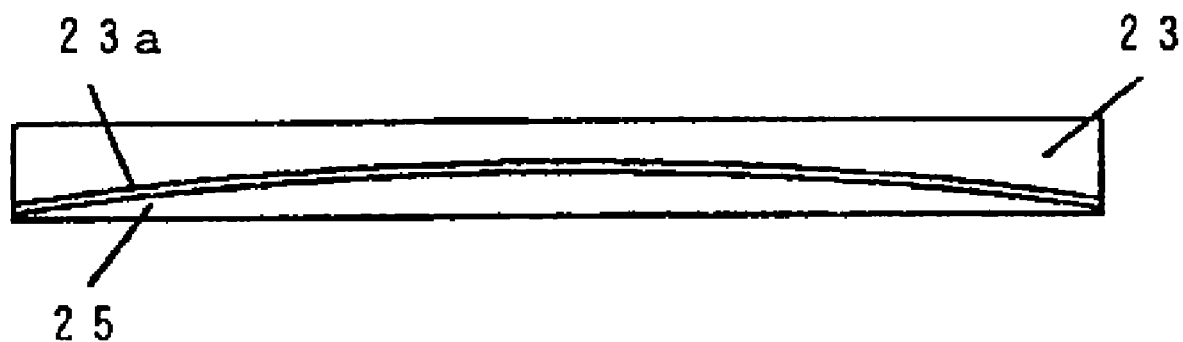
FIG. 11 is a partially enlarged sectional view showing another example modification of the fluorescent substance layer shown in FIG. 9.

In contrast, the fluorescent substance layer 25 may be formed in a flat convex lens form so as to become thinner with increasing distance from the optical axis as shown in FIG. 10 or 11. The convex side of the fluorescent substance layer 25 can either face inward or away from the optical member 23, and the optical member 23 can be shaped so as to conform to the convex surface of the fluorescent substance layer 25 when the convex surface faces inward toward the optical member 23 as shown in FIG. 11. This ensures that the optical path length is not substantially extended in the surrounding regions distant from the optical axis, despite an increase in incidence angle from the LED chip 21 to the fluorescent substance layer 25, allowing a reduction in chromaticity deviation such as when mixed color light becomes tinged with yellow.

The fluorescent substance layer 25 can be formed as a thin film, for example, by applying silicon or other material impregnated with a fluorescent substance onto a glass plate, etc. with equipment such as a spin coater, or can be formed by molding. In the case of molding, it is possible to readily produce the fluorescent substance layer 25 with a varying thickness, as mentioned earlier and as exemplified in FIG. 10 or 11.

The projection lens 12 can include a convex lens and can be arranged such that the optical axis is aligned with the central axis extending roughly horizontally to the front of the base 20 of the light source apparatus 11, and can also be arranged such that the focus position F on the side of the light source apparatus 11 is located near the optical member 23 of the light source apparatus 11.

A vehicle headlight 10 according to an embodiment of the presently disclosed subject matter can be configured as described above, and power supplied to the LED chip 21 causes light to be emitted from the LED chip 21 which causes light to be emitted from the resin portion 22 directly or after reflection by the internal surface of the cavity 20a of the base 20, which in turn causes light to fall on the fluorescent substance layer 25 and excite the fluorescent substance in the fluorescent substance layer 25. Then, yellow light—excitation light generated by the fluorescent substance—can be mixed with blue light from the LED chip 21 to change into white light, that will be emitted after transmission through the optical member 23, collected by the projection lens 12 and irradiated in a forward direction. At this time, part of the white light—the mixed color light—can be blocked by the light shielding portion 24, thus forming a cutoff. The image of the cutoff can be projected in the forward direction by the projection lens 12, thus providing a low-beam light distribution pattern L.

Isolation of the fluorescent substance layer 25 of the light source apparatus 11 from the LED chip 21 suppresses temperature rise in the fluorescent substance layer 25, reducing the difference in efficiency reduction as a result of temperature rise in the LED chip 21 and the fluorescent substance layer 25 and thereby suppressing chromaticity deviation in the mixed color light due to temperature rise.

The arrangement of the light shielding portion 24 such that it is close to the LED chip 21 in the light source apparatus 11 ensures high luminous intensity on the light shielding portion 24, thus allowing formation of a clear cutoff by projecting the image of the light shielding portion 24 forward by the projection lens 12.

According to experiments, for example, it is possible to obtain approximately 60% of the emitted light by spacing the LED chip 21 and the light shielding portion 24 within 2 mm apart and approximately 90% by spacing them within 1 mm apart.

The vehicle headlight can be simply configured by locating the focus position of the projection lens 12 near the light shielding portion 24 of the light source apparatus 11.

Further, provision of the reflection surface 24a on the inner surface of the light shielding portion 24 results in light incident on the light shielding portion 24 being reflected, allowing, through reuse, more light to pass through the light shielding portion 24 and be irradiated forward. This enhances extraction efficiency of light from the light source apparatus 11 by 10% or so.

Provision of the light shielding portion 24 with a given thickness can substantially or completely eliminate separation of red light from blue light due to chromatic aberration of the projection lens 12, thus changing light irradiated forward into white light suited for use in the vehicle headlight.

Figure 12:
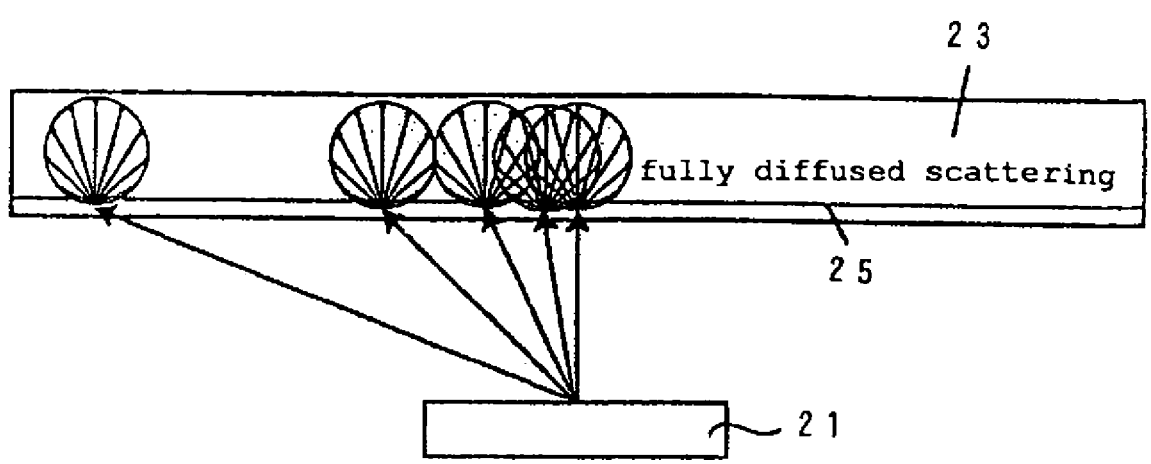
FIG. 12 is a schematic view showing the diffused state in the fluorescent substance layer for the light source apparatus shown in FIG. 4.

Further, isolation of the fluorescent substance layer 25 from the LED chip 21 allows light from the LED chip 21 to fall on the fluorescent substance layer 25 in a sufficiently diffused manner, as shown in FIG. 12, thus providing the brightness distribution of the mixed color light from the fluorescent substance layer 25 with a smooth gradation. This makes the secondary cutoff line substantially or completely inconspicuous in the light distribution pattern projected by the projection lens 12, thus considerably reducing light distribution stripes, etc. on the road surface.

Although isolation of the fluorescent substance layer 25 from the LED chip 21 may result in a decline in the center brightness to about ⅔, the decline in brightness can be partially compensated for by improved conversion efficiency of the fluorescent substance and improved light extraction efficiency by the reflection surface 24a. In addition, significant advantages such as reduction in uneven color and reduction in the generation of gradation in the brightness distribution can be obtained.

Thus, it is possible to improve conversion efficiency of the fluorescent substance in the fluorescent substance layer 25 in the event of temperature rise by isolating the fluorescent substance layer 25 from the LED chip 21, thus reducing chromaticity deviation due to temperature rise. It is also possible to improve axial brightness by arranging the light shielding portion 24 close to the LED chip 21, thus forming a clear cutoff.

Figure 13:
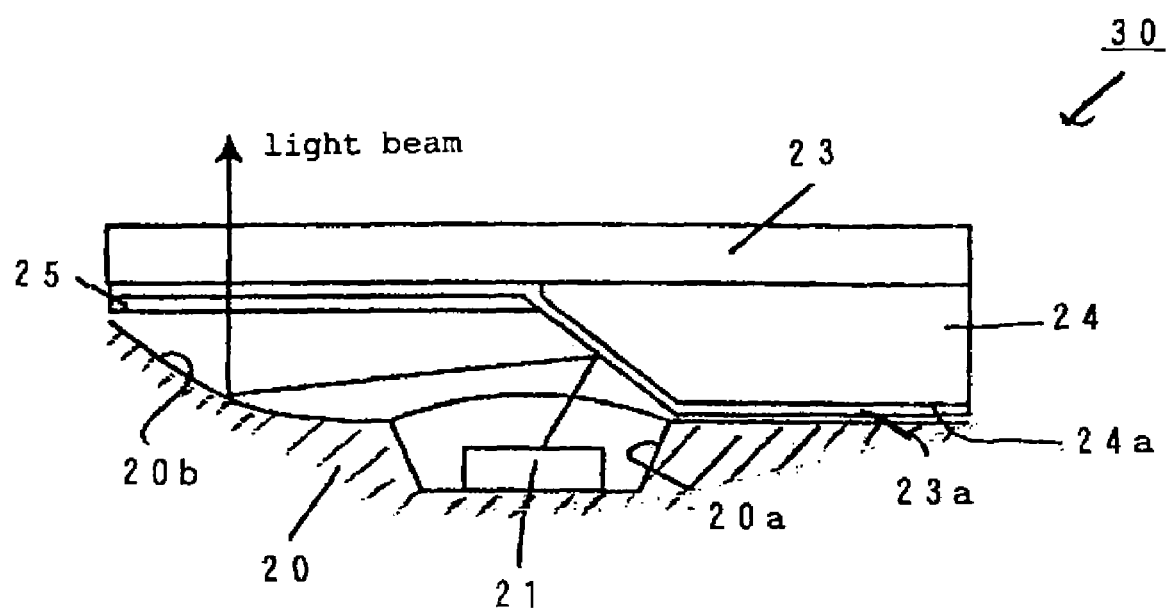
FIG. 13 is an enlarged partial sectional view showing portions of another embodiment of a vehicle headlight made in accordance with principles of the presently disclosed subject matter.

FIG. 13 illustrates a configuration for major portions of another embodiment of the presently disclosed subject matter.

In FIG. 13, the light source is configured as a vehicle headlight 30, having roughly the same configuration as the vehicle headlight 10, but differing from the vehicle headlight 10 shown in FIGS. 1 and 2 in that the reflection surface 24a of the light source apparatus 11 has a portion that is arranged diagonally relative to the surface that is perpendicular to the optical axis and in that the inner surface of the cavity 20a of the base 20 has a portion that is correspondingly formed as an oddly shaped reflection horn 20b.

In this case, the reflection surface 24a is formed by three-dimensionally configuring the light shielding portion 24, formed with a light shielding material, along the optical axis and mirror-polishing the surface of the light shielding portion 24. The vehicle headlight 30 can function in a similar manner as compared to the vehicle headlight 10 shown in FIGS. 1 and 2, and the majority of light incident on the light shielding portion 24 can be reflected by the reflection surface 24a, guided to the oddly shaped reflection horn 20b of the cavity 20a of the base 20, reflected by the oddly shaped reflection horn 20b and can fall onto the fluorescent substance layer 25 as secondary reflected light. Mixed color light from mixture with resultant excitation light can be emitted externally via the optical member 23. This further improves extraction efficiency of light from the light source apparatus 11.

Figure 14:
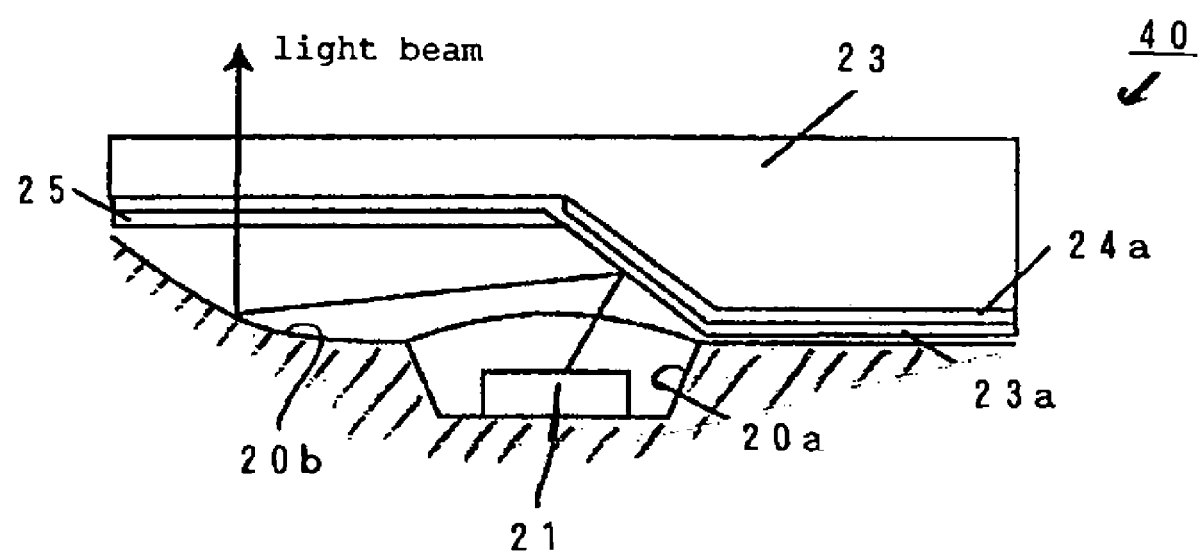
FIG. 14 is an enlarged partial sectional view showing a modification example of the embodiment of the vehicle headlight of FIG. 13.

FIG. 14 illustrates another embodiment of the disclosed subject matter in which the light source is configured as a vehicle headlight 40. Vehicle headlight 40 is an example of a modification of the vehicle headlight 30 shown in FIG. 13, and differs from the vehicle headlight 30 in that the reflection surface 24a of the light source apparatus 11 can include a thin metal film that also functions as the light shielding portion 24, and in that the optical member 23 can be correspondingly formed three-dimensionally so as to constitute the surface of the reflection surface 24a.

The vehicle headlight 40 can function in a similar manner as the vehicle headlight 30 shown in FIG. 13, and the majority of light incident on the reflection surface 24a can be reflected, guided to the oddly shaped reflection horn 20b of the cavity 20a of the base 20, reflected by the oddly shaped reflection horn 20b, and can fall onto the fluorescent substance layer 25 as secondary reflected light. As a result, mixed color light from mixture with resultant excitation light is emitted externally via the optical member 23. This further improves extraction efficiency of light from the light source apparatus 11.

Figure 15:
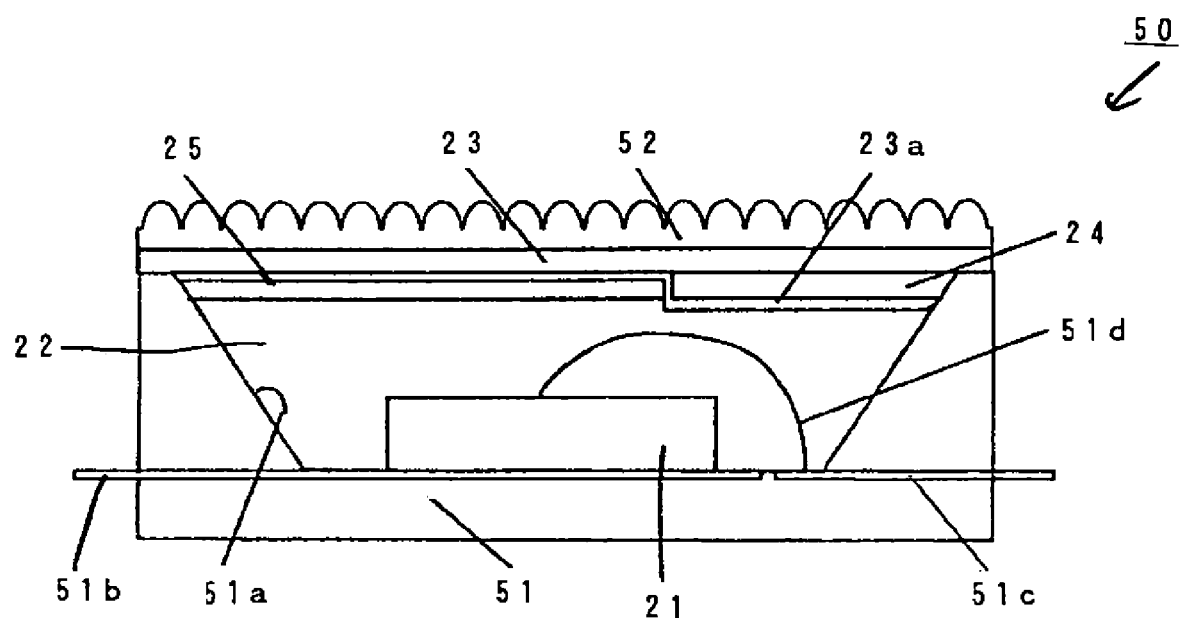
FIG. 15 is a schematic sectional view showing a configuration for a light source apparatus of another embodiment of the vehicle headlight made in accordance with the principles of the presently disclosed subject matter.

FIG. 15 illustrates another exemplary embodiment of the disclosed subject matter in which the light source is configured as a vehicle headlight 50. The vehicle headlight 50 can have roughly the same configuration as the vehicle headlight 10, but differs from the vehicle headlight 10 shown in FIGS. 1 and 2 in that the light source apparatus 11 can be provided with a base 51 configured as a ceramic base in place of the base 20 and in that the outer surface of the optical member 23 is provided with a microlens array 52 as a microtexture structure.

The base 51 can, for example, be made of a ceramic material such as aluminum nitride or alumina to form a ceramic base of laminated structure. The base 51 can include wiring patterns 51b and 51c for the LED chip 21. This allows the LED chip 21 to be die-bonded to the wiring pattern 51b exposed on the bottom surface of the cavity 51a, with the electrode portion on the upper surface of the LED chip 21 wire-bonded to the wiring pattern 51c by a gold wire 51d.

Figure 16:
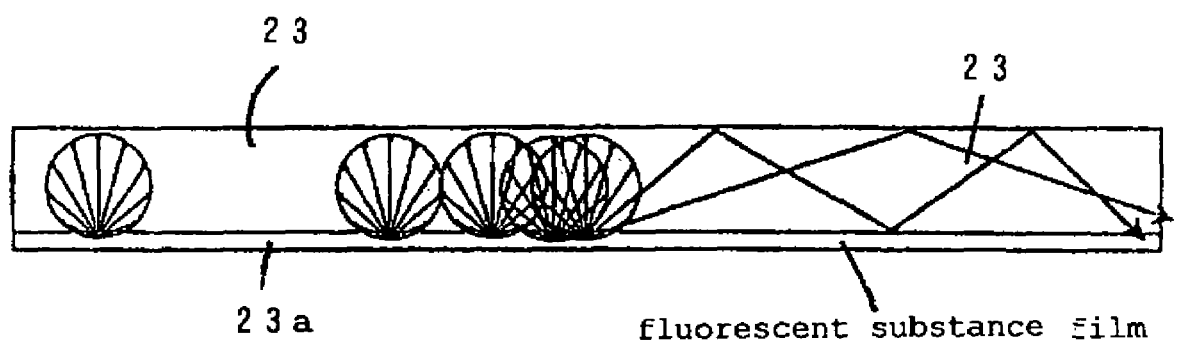
FIG. 16 is a partial sectional view showing light repeatedly reflected within an optical member in the light source apparatus shown in FIG. 15.
Figure 17:
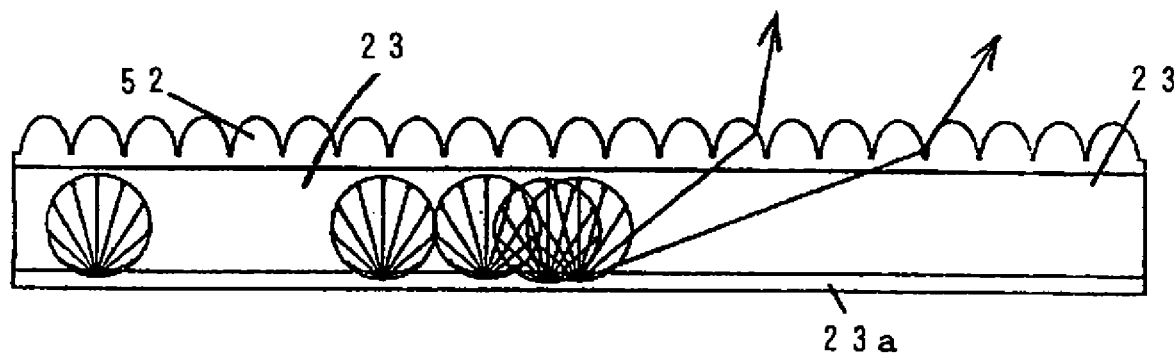
FIG. 17 is a partial sectional view showing the function of a microlens array in the light source apparatus shown in FIG. 15.

The microlens array 52 in the illustration can be formed integrally as a separate body and can be affixed to the optical member 23, that is the flat cover, for example, by adhesion. The microlens array 52 can emit light (light that is incident on the optical member 23 at a relatively large angle, repeatedly reflected by the inner surface within the optical member 23 and no longer capable of being emitted from the optical member 23 as shown in FIG. 16) from the outer surface of the optical member 23 as shown in FIG. 17.

Figure 18:
FIG. 18 is a partial sectional view showing an example configuration for a microprism provided in place of the microlens array in the light source apparatus shown in FIG. 15.
Figure 19:
FIG. 19 is a partial sectional view showing a configuration of another example of a microprism provided in place of the microlens array in the light source apparatus shown in FIG. 15.

It should be noted that while the microlens array 52 can be employed as a microtexture structure in this case, the presently disclosed subject matter is not limited thereby and other structures such as a microprism array 53 shown in FIG. 18 or a microprism array 54 shown in FIG. 19 may be provided as long as the microprism arrays 53 or 54 or other structure have similar optical functionality.

Further, by forming individual microlenses of the microlens array 52 as non-spherical lenses or by forming individual microprisms of the microprism array 53 or 54 as prisms in pyramid form, it is possible to refract light emitted from the optical member 23 using individual microlenses or microprisms and impart directivity along the optical axis to the emitted light. This allows more light flux to be incident within the acceptance angle of the projection lens 12, providing improved light utilization efficiency and higher luminous intensity of irradiated light for the vehicle headlight 50.

Figure 20:
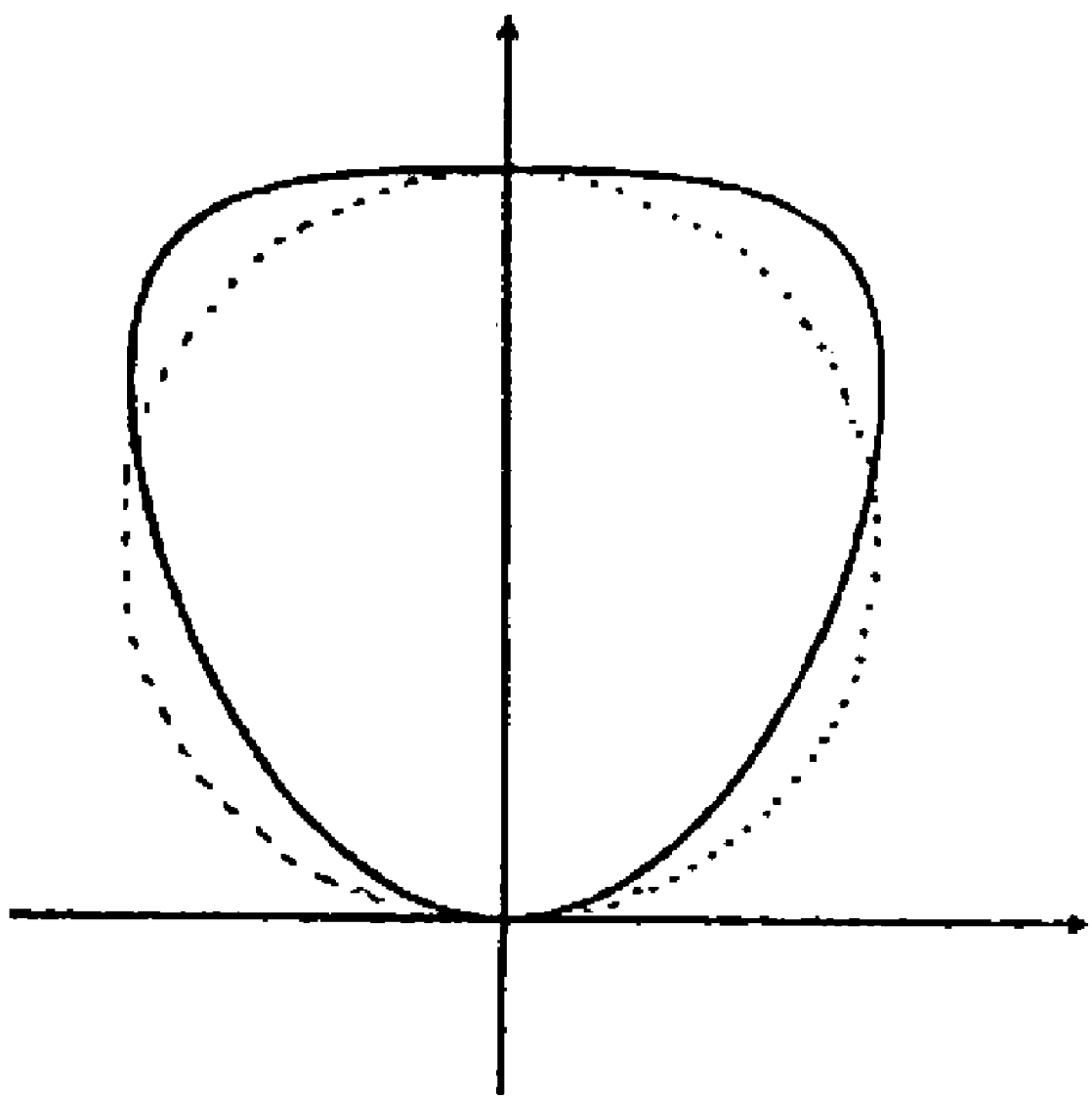
FIG. 20 is a directivity characteristic graph of the light source showing the effect of the microlens array shown in FIG. 15.

The vehicle headlight 50 functions similar to the vehicle headlight 10 shown in FIGS. 1 and 2, and it is possible to cause more light to be diffused forward, as shown by a solid line in FIG. 20, by externally radiating light that is repeatedly reflected by the inner surface within the optical member 23 serving as the flat cover, using the microlens array 52, thus improving extraction efficiency of light from the light source apparatus 11 by about 5 to 20%.

More specifically, approximately 12% improvement in light extraction efficiency can be achieved when individual microlenses of the microlens array 52 are formed as semi-spherical lenses of 50 μm in diameter.

In this case, the wiring patterns 51b and 51c can be integrated into the base 51 and provided in place of the lead terminals 27 that are separate from the base, thus keeping the parts count low and reducing parts and assembly costs.

Figure 21:
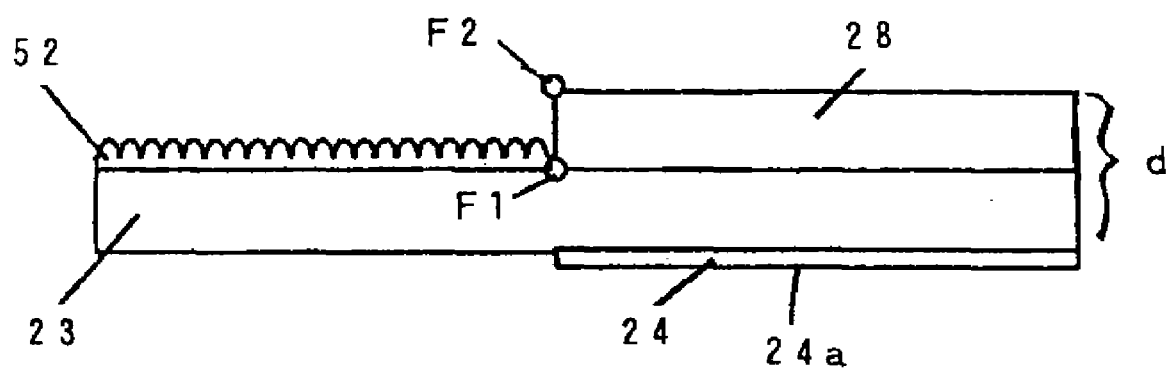
FIG. 21 is a partial sectional view showing a modification example of the light shielding portion for the light source apparatus shown in FIG. 15.
Figure 22:
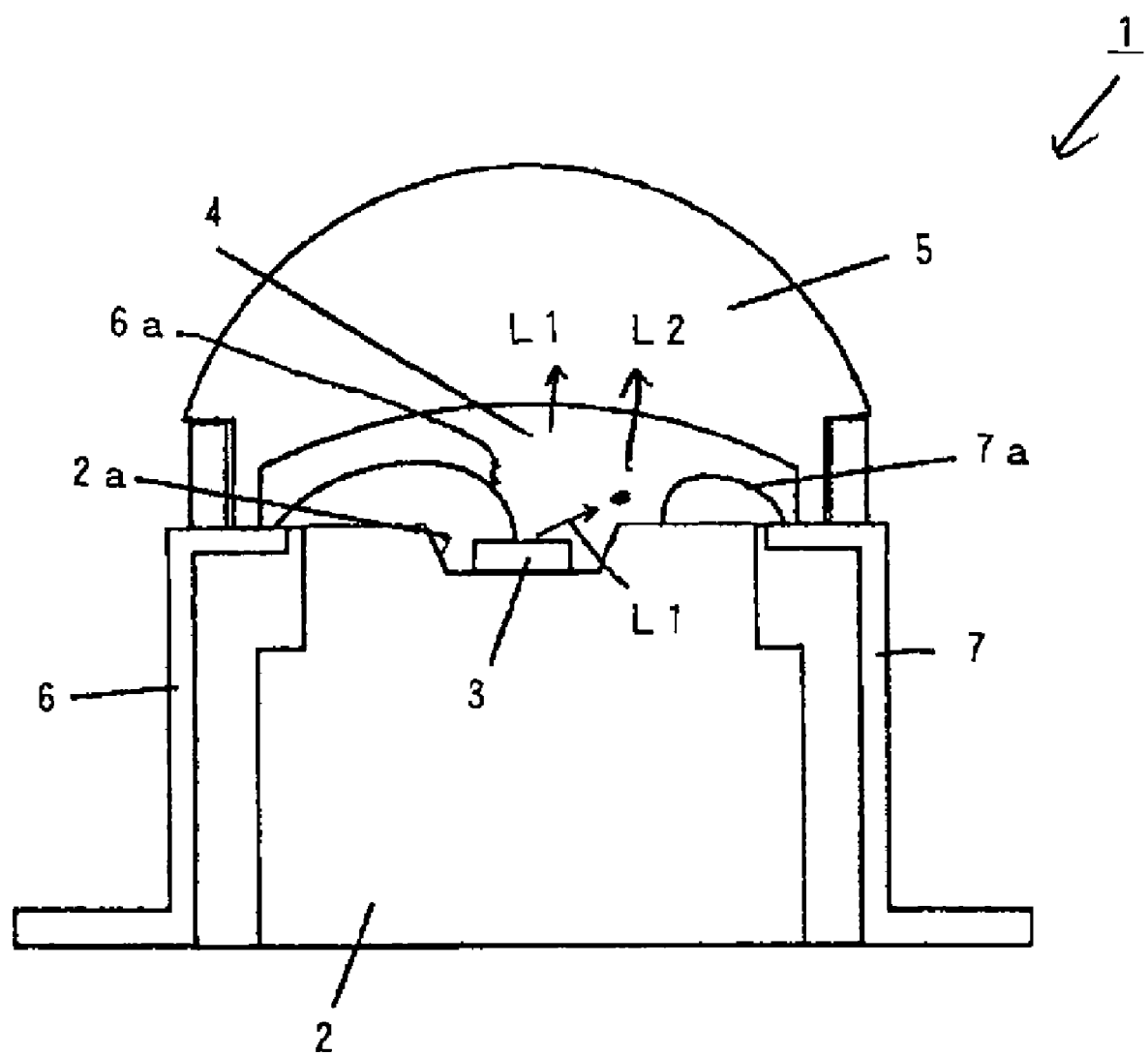
FIG. 22 is a schematic sectional view showing an example configuration of a light source apparatus used in a conventional vehicle headlight.

It should be noted that if a second light shielding portion 28 is provided on the outer surface of the optical member 23 in the vehicle headlight 50 to bring the substantial thickness of the light shielding portion 24 to the given thickness d and thereby compensate for chromatic aberration of the projection lens 12, it is helpful to arrange the end edge of the second light shielding portion 28 forward or outward of the microlens array 52. For this reason, the plate shaped member that can form the second light shielding portion 28 may be arranged at a position on the outer surface of the optical member 23 corresponding to the light shielding portion 24, as shown in FIG. 21. Alternatively, a structure that is substantially equivalent to the plate shaped member may be formed in advance and be integrally formed with the optical member 23 and coated or painted with light shielding material.

Although, in the foregoing embodiments, the end edges of the light shielding portion 24 and the second light shielding portion 28 are formed so as to eliminate light that is glaring to oncoming vehicles on the right-hand forward side of the automobile, with low-beam light distribution limited to traffic on left-hand side, the presently disclosed subject matter is not limited thereby and a similar effect can be obtained, in the case of traffic on right-hand side, by reversing the horizontal arrangement of the end edges of the light shielding portions 24 and 28.

While illustrative and exemplary embodiments of the presently disclosed subject matter have been described in detail herein, it is to be understood that the inventive concepts may be otherwise and variously embodied without departing from the spirit and scope of the disclosed subject matter and invention. For example, the cavity of the base structure in which the LED chip is located can be integrally formed in the top surface of the base structure or it can be independently formed and attached to the top of the base structure. Moreover, the cavity can be formed as a part of the LED chip itself such that the LED chip radiates light along the optical axis of the light source device. In addition, the light source can be used in apparatus other than vehicle headlights, such as vehicle tail lights, projection lights, light boards, and any type of lighting device in which directivity of light is desired and the light source is compact. The appended claims are intended to be construed to include all such variations that fall within the spirit and scope of the invention.

What is claimed is:

1. A light source device configured to emit light in a light emitting direction and along an optical axis, comprising:
   a base having an upper surface and a cavity located at the upper surface;
   an LED chip located adjacent the cavity of the base;
   a resin portion located adjacent the LED chip;
   an optical member disposed adjacent the upper surface of the base and separate from the LED chip and having an inner surface facing towards the LED chip;
   a light shielding portion disposed adjacent the inner surface of the optical member and configured to form a cutoff suited for a light distribution pattern; and
   a fluorescent substance layer disposed adjacent the inner surface of the optical member and at least in a region other than the light shielding portion when the device is viewed from the light emitting direction.

2. The light source device according to claim 1, wherein the base is formed from a ceramic material.

3. The light source device according to claim 1, wherein the optical member is a flat cover.

4. The light source device according to claim 1, wherein the light shielding portion is positioned within 2 mm from the LED chip.

5. The light source device according to claim 1, wherein the light shielding portion includes a thin film formed on the inner surface of the optical member.

6. The light source device according to claim 1, wherein the light shielding portion includes a plate member adhered to the inner surface of the optical member.

7. The light source device according to claim 6, wherein the plate member has a given thickness in a direction parallel to the optical axis that is substantially uniform about an entire extent of the plate member.

8. The light source device according to claim 1, further comprising:
a second light shielding portion disposed on an outer surface of the optical member.

9. The light source device according to claim 1, wherein an inner surface of the light shielding portion includes a reflection surface configured to reflect light emitted from the LED chip.

10. The light source device according to claim 9, wherein the reflection surface is disposed at an angle with respect to the optical axis so as to reflect light received from the LED chip at an angle with respect to the optical axis.

11. The light source device according to claim 10, wherein the base cavity includes a second reflection surface that is located and positioned to receive light that is reflected by the reflection surface of the light shielding portion from the LED chip towards the light emitting direction of the device.

12. The light source device according to claim 11, wherein the reflection surface includes a thin metal film formed on the light shielding portion.

13. The light source device according to claim 11, wherein the reflection surface includes a surface of the light shielding portion made of a metallic material.

14. The light source device according to claim 1, wherein the fluorescent substance layer is formed in thin film form.

15. The light source device according to claim 14, wherein the fluorescent substance layer is formed by impregnating silicon film with a fluorescent substance.

16. The light source device according to claim 15, wherein the optical member and an inner surface of the light shielding portion are each at least partially coated with a SiO$_2$ layer.

17. The light source device according to claim 14, wherein the fluorescent substance layer is thinner in a direction parallel to the optical axis with increasing distance from the optical axis.

18. The light source device according to claim 3, wherein an outer surface of the flat cover is provided with a microtexture structure at least in a region not corresponding to the light shielding portion.

19. The light source device according to claim 18, wherein the microtexture structure is formed on a surface of the flat cover.

20. A vehicle headlight comprising:
the light source device according to claim 1; and
a projection lens disposed adjacent the light source device and having a focus located substantially at the light shielding portion, wherein the projection lens is configured to irradiate emission light forward in a shape defined by the light shielding portion.

21. The light source device according to claim 1, wherein the light source device is configured as a vehicle headlight and the light shielding portion is configured to produce a low-beam vehicle light distribution.

22. A light source device configured to emit light in a light emitting direction and along an optical axis, comprising:
a base having an upper surface and a cavity located at the upper surface;
an LED chip located adjacent the cavity of the base;
a light shielding portion disposed adjacent the LED chip and configured to form a cutoff suited for a light distribution pattern, an inner surface of the light shielding portion including a reflection surface configured to reflect light emitted from the LED chip, wherein
the reflection surface is disposed at an angle with respect to the optical axis so as to reflect light received from the LED chip at an angle with respect to the optical axis, and
the base includes a base reflection portion that is located and positioned to receive light that is reflected by the reflection surface of the light shielding portion from the LED chip towards the light emitting direction of the device.

23. The light source device according to claim 22, wherein the reflection surface includes a thin metal film formed on the light shielding portion.

24. The light source device according to claim 22, wherein the base reflection portion is positioned at an angle with respect to the optical axis.

25. The light source device according to claim 22, further comprising:
a fluorescent substance layer disposed adjacent the LED chip and at least in a region other than the light shielding portion when the device is viewed from the light emitting direction.

26. The light source device according to claim 22, further comprising:
an optical member disposed adjacent the upper surface of the base and separate from the LED chip and having an inner surface facing towards the LED chip.

* * * * *

UNITED STATES PATENT AND TRADEMARK OFFICE
CERTIFICATE OF CORRECTION

PATENT NO.        : 7,753,573 B2
APPLICATION NO.   : 11/781337
DATED             : July 13, 2010
INVENTOR(S)       : Yasushi Yatsuda et al.

It is certified that error appears in the above-identified patent and that said Letters Patent is hereby corrected as shown below:

Please add Section (63) as indicated below:

Continuation of application No. 10/808,551, filed on Mar. 25, 2004, now Pat. No. 7,246,930.

Please add Section (30) as indicated below:

Sep. 17, 2003   (JP) ............................................ 2003-323820

Signed and Sealed this

Nineteenth Day of October, 2010

David J. Kappos
*Director of the United States Patent and Trademark Office*